US012604775B2

(12) United States Patent
Lee et al.

(10) Patent No.: US 12,604,775 B2
(45) Date of Patent: Apr. 14, 2026

(54) SEMICONDUCTOR CHIP AND SEMICONDUCTOR PACKAGE

(71) Applicant: Samsung Electronics Co., Ltd., Suwon-si (KR)

(72) Inventors: Hyeonmin Lee, Suwon-si (KR); Jihoon Kim, Suwon-si (KR); Aenee Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 309 days.

(21) Appl. No.: 18/141,675

(22) Filed: May 1, 2023

(65) Prior Publication Data

US 2024/0047389 A1 Feb. 8, 2024

(30) Foreign Application Priority Data

Aug. 3, 2022 (KR) ........................ 10-2022-0096703

(51) Int. Cl.
*H01L 23/00* (2006.01)
*H01L 25/065* (2023.01)
(Continued)

(52) U.S. Cl.
CPC ............ *H10W 90/00* (2026.01); *H10W 72/01* (2026.01); *H10W 72/0198* (2026.01);
(Continued)

(58) Field of Classification Search
CPC ............................ H01L 25/0657; H01L 24/05
See application file for complete search history.

(56) References Cited

U.S. PATENT DOCUMENTS 8,710,607 B2 4/2014 Chen et al.
9,142,517 B2 9/2015 Liu et al.
(Continued)

FOREIGN PATENT DOCUMENTS

KR 1020220057116 A 5/2022
KR 1020230142082 A 10/2023

*Primary Examiner* — Ali Naraghi
(74) *Attorney, Agent, or Firm* — Muir Patent Law, PLLC

(57) ABSTRACT

A semiconductor package includes a first semiconductor chip including a first substrate, a plurality of first pads disposed on a front surface of the first substrate, a first insulating layer surrounding the plurality of first pads, and a plurality of wiring patterns disposed between the first substrate and the plurality of first pads and electrically connected to the plurality of first pads; and a second semiconductor chip disposed below the first semiconductor chip and including a second substrate, a plurality of second pads disposed on the second substrate and contacting the plurality of first pads, a second insulating layer surrounding the plurality of second pads and contacting the first insulating layer, and a plurality of through-electrodes penetrating through the second substrate to be connected to the plurality of second pads. The plurality of wiring patterns include top wiring patterns adjacent to the plurality of first pads in a direction perpendicular to the front surface. On a plane parallel to the front surface, within a first region having a first shape and first region area from a top down view, first top wiring patterns have a first occupied area between adjacent first pads of a first group of first pads from among the plurality of first pads, and within a second region having the first shape and first region area from a top down view, second top wiring patterns have a second occupied area, larger than the first occupied area, between adjacent first pads of a second group of first pads from among the plurality of first pads. From a top down view, each pad of the first group of first pads has a first area, and each pad of the second
(Continued)

10 group of first pads has a second area, wherein the first area is smaller than a second area.

20 Claims, 19 Drawing Sheets

(51) Int. Cl.

| | |
|---|---|
| *H10W 90/00* | (2026.01) |
| *H10W 72/00* | (2026.01) |
| *H10W 72/90* | (2026.01) |
| *H10W 80/00* | (2026.01) |
| *H10W 90/20* | (2026.01) |

(52) U.S. Cl.

CPC ........ *H10W 72/921* (2026.01); *H10W 72/923* (2026.01); *H10W 72/926* (2026.01); *H10W 72/932* (2026.01); *H10W 72/934* (2026.01); *H10W 72/936* (2026.01); *H10W 72/9445* (2026.01); *H10W 72/952* (2026.01); *H10W 72/953* (2026.01); *H10W 80/211* (2026.01); *H10W 80/312* (2026.01); *H10W 80/327* (2026.01); *H10W 80/334* (2026.01); *H10W 90/297* (2026.01); *H10W 90/792* (2026.01)

(56) References Cited

U.S. PATENT DOCUMENTS

| | | | | |
|---|---|---|---|---|
| 10,651,153 | B2 | 5/2020 | Fastow et al. | |
| 11,139,272 | B2 * | 10/2021 | Makala ................... | H01L 24/89 |
| 11,227,835 | B2 * | 1/2022 | Ha ....................... | H01L 23/3121 |
| 11,233,088 | B2 * | 1/2022 | Chen ....................... | H01L 24/94 |
| 12,266,638 | B2 * | 4/2025 | Park ......................... | H01L 23/12 |
| 2014/0145338 | A1 * | 5/2014 | Fujii ..................... | H10F 39/811 |
| | | | | 257/762 |
| 2019/0051628 | A1 * | 2/2019 | Liu ......................... | H01L 24/80 |
| 2021/0043673 | A1 * | 2/2021 | Kwon ................. | H10F 39/8023 |
| 2023/0317654 | A1 | 10/2023 | Kim et al. | |

* cited by examiner

10C

10C

I–I'

SEMICONDUCTOR CHIP AND SEMICONDUCTOR PACKAGE

CROSS-REFERENCE TO RELATED APPLICATION(S)

This application claims benefit of priority to Korean Patent Application No. 10-2022-0096703 filed on Aug. 3, 2022 in the Korean Intellectual Property Office, the disclosure of which is incorporated herein by reference in its entirety.

BACKGROUND

The present disclosure relates to a semiconductor chip and a semiconductor package.

Various types of semiconductor packages have been developed as demand for high capacity, thinning, and miniaturization of electronic products has increased. In recent years, a direct bonding technology for bonding semiconductor chips without an adhesive film (for example, a nonconductive film (NCF)) or a connection bump (for example, a solder ball) has been developed as a method of incorporating more components (for example, semiconductor chips) into a package structure.

SUMMARY

Example embodiments provide a semiconductor chip having improved surface topology characteristics of a bonding surface.

Example embodiments provide a semiconductor package having improved quality in a bonding interface of a semiconductor chip stack.

According to an example embodiment, a semiconductor device includes a first semiconductor chip including a first substrate, a plurality of first pads disposed on a front surface of the first substrate, a first insulating layer surrounding the plurality of first pads, and a plurality of wiring patterns disposed between the first substrate and the plurality of first pads and electrically connected to the plurality of first pads; and a second semiconductor chip disposed below the first semiconductor chip and including a second substrate, a plurality of second pads disposed on the second substrate and contacting the plurality of first pads, a second insulating layer surrounding the plurality of second pads and contacting the first insulating layer, and a plurality of through-electrodes penetrating through the second substrate to be connected to the plurality of second pads. The plurality of wiring patterns include top wiring patterns adjacent to the plurality of first pads in a direction perpendicular to the front surface. On a plane parallel to the front surface, within a first region having a first shape and first region area from a top down view, first top wiring patterns have a first occupied area between adjacent first pads of a first group of first pads from among the plurality of first pads, and within a second region having the first shape and first region area from a top down view, second top wiring patterns have a second occupied area, larger than the first occupied area, between adjacent first pads of a second group of first pads from among the plurality of first pads. From a top down view, each pad of the first group of first pads has a first area, and each pad of the second group of first pads has a second area, wherein the first area is smaller than a second area.

According to an example embodiment, a semiconductor package includes a first semiconductor chip including a first substrate, a plurality of first pads disposed on a front surface of the first substrate, a first insulating layer surrounding the plurality of first pads, and top wiring patterns adjacent to the plurality of first pads between the first substrate and the plurality of first pads in a direction perpendicular to the front surface; and a second chip disposed below the first semiconductor chip and including a second substrate, a plurality of second pads disposed on the second substrate and contacting the plurality of first pads, a second insulating layer surrounding the plurality of second pads and contacting the first insulating layer, and a plurality of through-electrodes penetrating through the second substrate to be connected to the plurality of second pads. The top wiring patterns include a set of first contact patterns contacting a first group of first pads, the first group of first pads including pairs of first pads adjacent to each other in a first direction parallel to the front surface, a set of second contact patterns contacting a second group of first pads, the second group of first pads including pairs of first pads adjacent to each other in the first direction, and at least one trace pattern disposed between adjacent contact patterns of the second contact patterns in the first direction. Each first pad of the first group of first pads has a first width in the first direction, and each pad of the second group of first pads has a second width in the first direction, wherein the first width is narrower than the second width.

According to an example embodiment, a semiconductor package includes at least one semiconductor chip including a first substrate, a plurality of first pads disposed on a front surface of the first substrate, a first insulating layer surrounding the plurality of first pads, and a plurality of wiring patterns disposed between the first substrate and the plurality of first pads and electrically connected to the plurality of first pads. The plurality of first pads include first pairs of first pads and second pairs of first pads, each first pad of the first pair having a first area from a plan view and each first pad of the second pair having a second area from the plan view, the second area being larger than the first area. Within respective first reference regions between two pads of respective first pairs of first pads adjacent to each other, respective first top wiring patterns adjacent to the respective first pairs of first pads in a direction perpendicular to the first surface have a first predetermined occupied area, and within respective second reference regions between two pads of respective second pairs of first pads adjacent to each other, respective second top wiring patterns adjacent to the respective second pairs of first pads in a direction perpendicular to the first surface have a second predetermined occupied area. Each first reference region has the same area and shape as each second reference region, and each first pair of first pads in a respective reference region has an area within the respective reference region proportional to the respective first predetermined occupied area according to a first ratio. Each second pair of first pads in a respective reference region has an area within the respective reference region proportional to the respective second predetermined occupied area according to the first ratio.

According to an example embodiment, a semiconductor chip includes: a first substrate, a plurality of first pads disposed on a front surface of the first substrate, a first insulating layer surrounding the plurality of first pads, and top wiring patterns disposed between the first substrate and the plurality of first pads, electrically connected to the plurality of first pads, and adjacent to the plurality of first pads in a direction, perpendicular to the front surface. On a plane parallel to the front surface, the top wiring patterns may have a predetermined occupied area within a reference region between a pair of first pads adjacent to each other, among the plurality of first pads, and the pair of first pads may have an area, proportional to the occupied area.

According to an example embodiment, a method of manufacturing a semiconductor package includes: preparing a semiconductor wafer including a preliminary substrate, a circuit layer disposed on a front surface of the preliminary substrate, and a preliminary insulating layer disposed on the circuit layer, the circuit layer including at least a pair of first contact patterns, at least a pair of second contact patterns, and at least one trace pattern disposed between the at least a pair of second contact patterns; etching at least a portion of the preliminary insulating layer to form first etching grooves, exposing at least a portion of the at least a pair of first contact patterns, and second etching grooves, exposing at least a portion of the at least a pair of second contact patterns, the at least a pair of first contact patterns having a first occupied area between the first etching grooves, and the at least a pair of second contact patterns and the at least one trace pattern having a second occupied area, larger than the first occupied area, between the second etching grooves; forming a conductive material layer on the preliminary insulating layer to fill the first etching grooves and the second etching grooves; and polishing the conductive material layer and the preliminary insulating layer to form a first group of front pads disposed in the first etching groove and having a first area, a second group of front pads disposed in the second etching groove and having a second area, larger than the first area, and a front insulating layer surrounding the first group of front pads and the second group of front pads.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
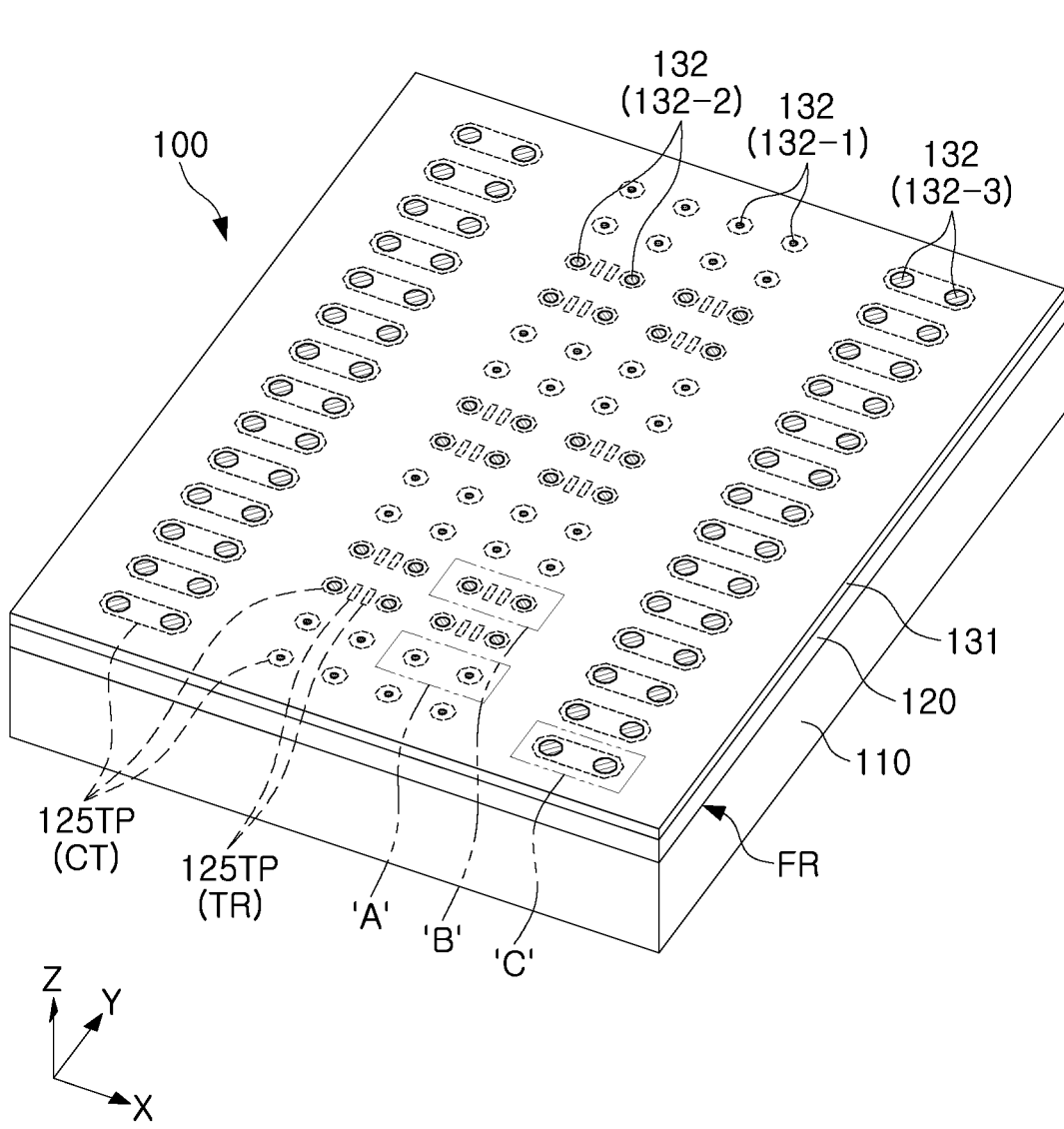
FIG. 1 is a perspective view of a semiconductor package according to an example embodiment.

FIG. 1 is a perspective view of a semiconductor package 10 according to an example embodiment.

Referring to FIG. 1, a semiconductor package 10 according to an example embodiment may include at least one semiconductor chip, for example, a first semiconductor chip 100. The first semiconductor chip 100 may include a first substrate 110, a first circuit layer 120, a first insulating layer 131, a plurality of pads 132, and uppermost layer wiring patterns 125TP in the first circuit layer 120. The first semiconductor chip 100 may have a bonding surface defined by the first insulating layer 131 and the plurality of pads 132. For example, the first insulating layer 131 and the plurality of pads 132 may combine to form a flat, planar surface. Since the first semiconductor chip 100 according to an example embodiment has a bonding surface having improved surface characteristics, a semiconductor chip stack having a bonding interface having improved quality may be implemented.

According to the present disclosure, surface topology characteristics of the first insulating layer 131 may be improved by forming the plurality of pads 132 to have different sizes (e.g., different connecting surface areas) based on a distribution of top wiring patterns 125TP. Accordingly, when the first semiconductor chip 100 constitutes a stack structure together with another device, for example, another semiconductor chip, a silicon-interposer, or the like, adhesion of the first insulating layer 131 may be improved, and noncontact of the plurality of pads 132 may be prevented. The first semiconductor chip 100 and the other device may be directly bonded and coupled to each other without a connection member such as a metal bump (for example, such bonding may be referred to as "hybrid bonding" or "direct bonding"). This will be described later in more detail with reference to FIG. 8.

Hereinafter, the "first insulating layer 131" may be referred to as a "front insulating layer" or a "first front insulating layer" to distinguish locations of components in the first semiconductor chip 100. In addition, the "pad 132" may be referred to as a "front pad." Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The first substrate 110 may have a front surface FR on which the first circuit layer 120 is disposed. The first substrate 110 may be a semiconductor wafer substrate. For example, the first substrate 110 may be a semiconductor wafer formed of or including a semiconductor element, such as silicon or germanium, or a semiconductor compound such as silicon carbide (SiC), gallium arsenide (GaAs), indium arsenide (InAs), or indium phosphide (InP). The front surface FR may have an active region doped with impurities.

Figure 3A:
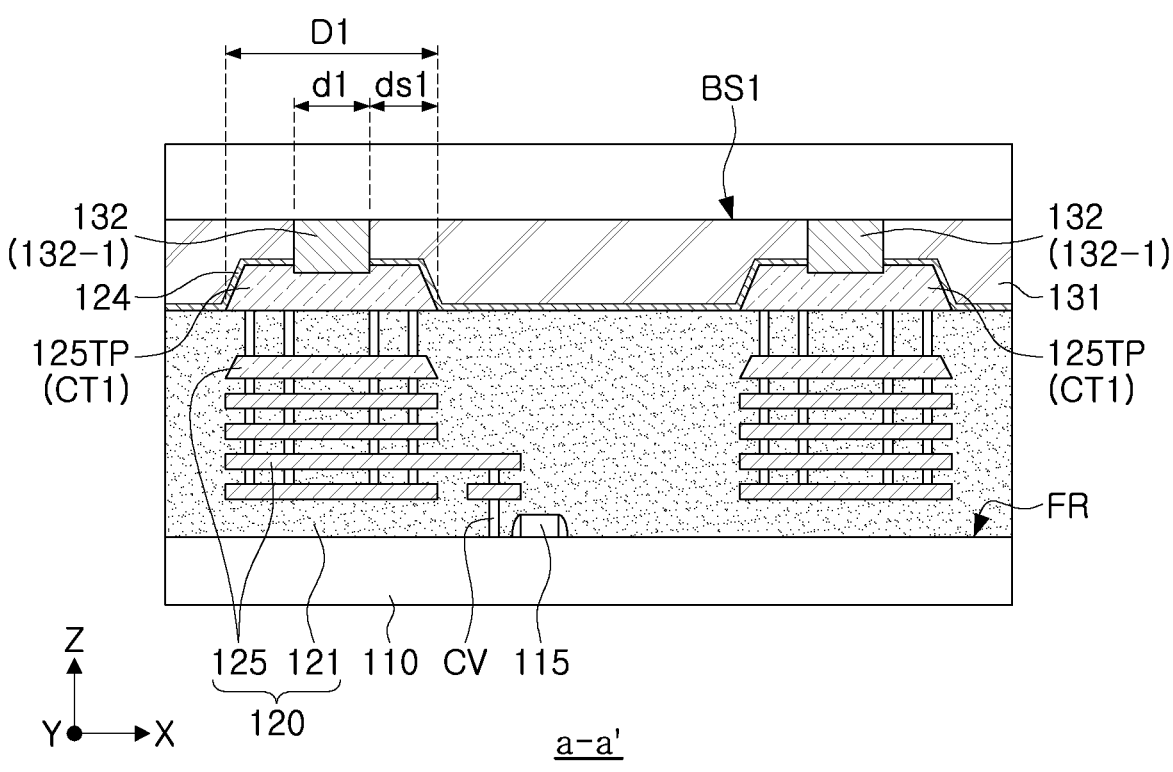
FIG. 3A is a cross-sectional view taken along line a-a' of FIG. 2A.
Figure 3B:
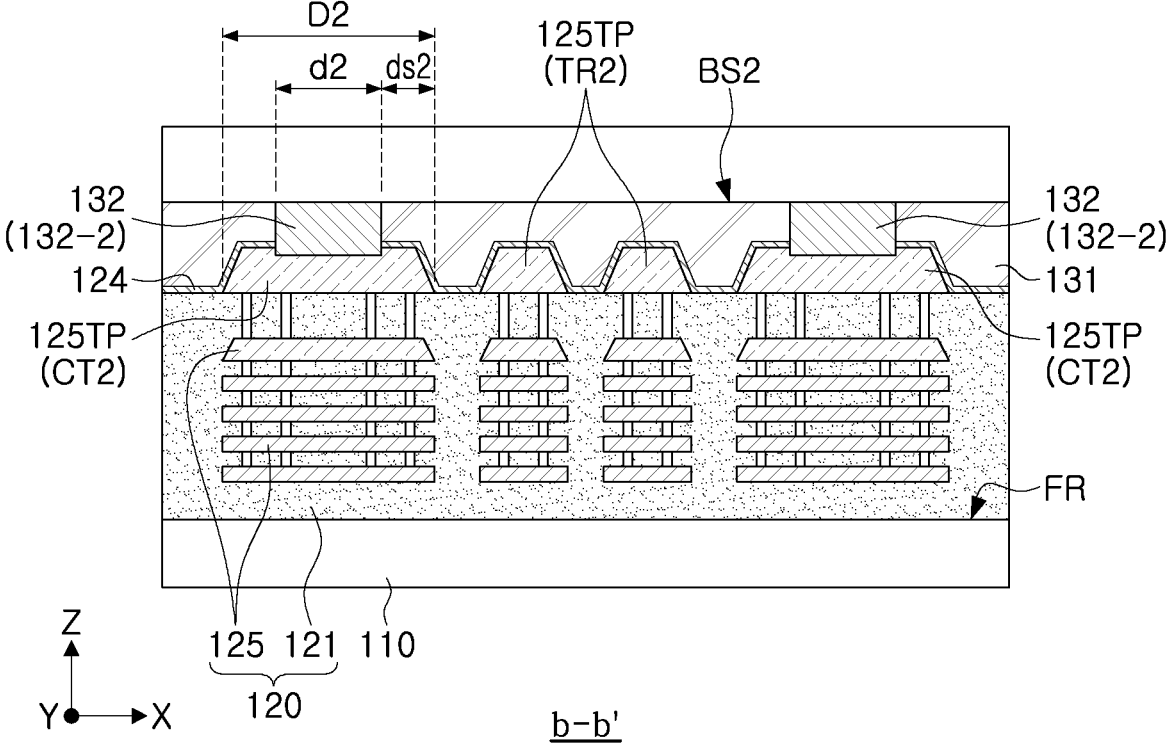
FIG. 3B is a cross-sectional view taken along line b-b' of FIG. 2B.
Figure 3C:
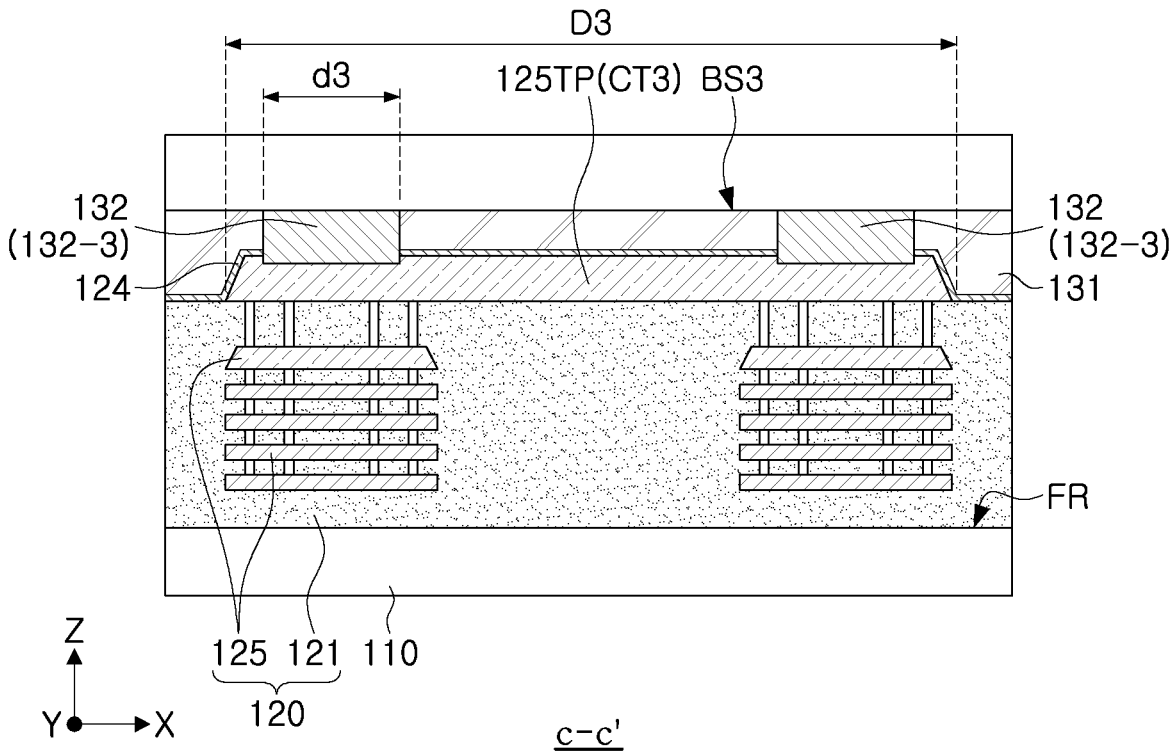
FIG. 3C is a cross-sectional view taken along line c-c' of FIG. 2C.

The first circuit layer 120 may include a first wiring structure (125 of FIG. 3A), disposed on the front surface FR of the first substrate 110 and connected to an active region, and a first interlayer insulating layer (121 of FIG. 3A) surrounding the first wiring structure ('125' of FIG. 3A). Referring to FIGS. 3A to 3C, the first interlayer insulating layer 121 may include or be formed of a flowable oxide (FOX), Tonen Silazane (TOSZ), undoped silica glass (USG), borosilica glass (BSG), phosphoxilica glass (PSG), borophosphosilica glass (BPSG), plasma enhanced tetraeth-ylorthosilicate (PETEOS), fluoride silicate glass (FSG), high-density plasma (HDP) oxide, plasma enhanced oxide (PEOX), flowable CVD (FCVD) oxide, or combinations thereof. At least a portion of the first interlayer insulating layer 121, surrounding the first wiring structure 125, may include a low-κdielectric layer. The first interlayer insulating layer 121 may be formed using a chemical vapor deposition (CVD) process, a flowable-CVD process, or a spin coating process.

The first wiring structure 125 may be formed to have a multilayer structure including a plurality of wiring patterns and a plurality of vias, including or formed of, for example, aluminum (Al), gold (Au), cobalt (Co), copper (Cu), nickel (Ni), lead (Pb), tantalum (Ta), tellurium (Te), titanium (Ti), tungsten (W), or combinations thereof. A barrier layer, not illustrated, including titanium (Ti), titanium nitride (TiN), tantalum (Ta), or tantalum nitride (TaN) may be disposed between the wiring pattern and/or via and the first interlayer insulating layer 121. Individual devices 115 constituting an integrated circuit may be disposed on the front surface of the first substrate 110. In this case, the first wiring structure 125 may be electrically connected to the individual devices 115 through an interconnect portion CV (for example, a contact plug). The individual devices 115 may include a field effect transistor (FET) such as a planar FET or a FinFET, a memory device such as a flash memory, a dynamic random access memory (DRAM), a static random access memory (SRAM), an electrically erasable programmable read-only memory (EEPROM), a phase-change random access memory (PRAM), a magnetoresistive random access memory (MRAM), a ferroelectric random access memory (FeRAM), or a resistive random access memory (RRAM), a logic device such as AND, OR, and NOT, and various active devices and/or passive devices such as a system large scale integration (LSI), a CMOS imaging sensor (CIS), and a micro-electro-mechanical systems (MEMS).

The first wiring structure 125 may be disposed between the first substrate 110 and the plurality of pads 132 and may be electrically connected to the plurality of pads 132. The first wiring structure 125 (or the plurality of wiring patterns) may include top wiring patterns 125TP adjacent to the plurality of pads 132 in a direction (a Z-direction), perpendicular to the front surface FR of the first substrate 110. As an example, the top wiring patterns 125TP may include or be formed of a material, different from a material of the plurality of pads 132, for example, aluminum (Al) or an aluminum (Al) alloy. The top wiring patterns 125TP may include contact patterns CT, contacting the plurality of pads 132, and trace patterns TR which do not contact the plurality of pads 132. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the verb "contact"), there are no intervening elements present at the point of contact. In FIG. 1, the contact patterns CT and the trace patterns TR are illustrated together with the plurality of pads 132. The top wiring patterns 125TP may be covered with a capping barrier layer (124 of FIG. 3A). The capping barrier layer 124 may extend between the first insulating layer 131 and the top wiring patterns 125TP. The capping barrier layer 124 may include or be formed of at least one of, for example, silicon nitride (SiN), silicon carbide (SiC), silicon oxynitride (SiON), silicon carbonitride (SiCN), aluminum nitride (AlN), aluminum oxynitride (AlON), and may include at least one of aluminum oxide (AlO), or aluminum oxide carbide (AlOC).

The first insulating layer 131 may be disposed on the front surface FR of the first substrate 110 and may surround side surfaces of the plurality of pads 132. The first insulating layer 131 may include or be formed of, for example, silicon oxide (SiO) or silicon carbonitride (SiCN). The first insulating layer 131 may form a bonding surface provided for direct bonding, formed between the plurality of pads 132. A surface topology of the first insulating layer 131 may be affected by an arrangement form of the top wiring patterns 125TP disposed directly below the first insulating layer 131. As used with orientation terms such as "above" and "below", the term "directly" refers to being both above or below and also overlapping from a plan view. Items may be described as "above" or "below" or the like, without overlapping from a plan view, but simply by being at different vertical levels in relation to a substrate. According to the present disclosure, the surface topology of the first insulating layer 131 may be improved and a semiconductor chip stack having improved bonding quality may be implemented.

The plurality of pads 132 may be disposed on the front surface FR of the first substrate 110. The plurality of pads 132 may penetrate through the first insulating layer 131 and the capping barrier layer 124, covering the top wiring patterns 125TP, to contact the contact patterns CT. The plurality of pads 132 may include or be formed of at least one of, for example, copper (Cu), nickel (Ni), gold (Au), silver (Ag), titanium (Ti), titanium nitride (TiN), tantalum (Ta), or tantalum nitride (TaN).

According to the present disclosure, a topology of the bonding surface may be improved by forming the plurality of pads 132 to have various areas (e.g., various connecting surface areas) depending on designs of the contact patterns CT and the trace patterns TR.

For example, on a plane (an X-Y plane) parallel to the front surface FR of the first substrate 110, the top wiring patterns 125TP may have a predetermined occupied area within a predetermined reference region formed between a pair of pads adjacent to each other. For example, a pair of pads adjacent to each other may be two first pads 132-1 adjacent in the X direction, two second pads 132-2 adjacent in the X direction, or two third pads 132-3 adjacent in the X direction. Each pair of pads (for example, a pair of first pads 132-1, pair of second pads 132-2, or pair of third pads 132-3) within the predetermined reference region may have an area proportional to the respective occupied area. The same proportionality, or ratio of area covered, may apply for the pair of first pads 132-1 with respect to the occupied area of the top wiring patterns 125TP connected to the pair of first pads 132-1, the pair of second pads 132-2 with respect to the occupied area of the top wiring patterns 125TP connected to the pair of second pads 132-2, and the pair of third pads 132-3 with respect to the occupied area of the top wiring patterns 125TP connected to the pair of third pads 132-3. For example, a pair of pads (for example, 132-1, 132-2, or 132-3) may be formed to have an area reduced as the occupied area of the top wiring patterns 125TP is reduced within a predetermined reference region therebetween (wherein an area of the predetermined reference region remains constant for different pairs of pads). The term "predetermined reference region" may refer to a rectangular region defined by first sides (e.g., extending in the Y direction), passing through centers of a pair of adjacent pads (for example, passing between centers of adjacent pads 131-1, or passing between centers of adjacent pads 132-2, or passing between centers of adjacent pads 132-3) to be parallel to each other, and second, parallel sides (e.g., extending in the X direction) connecting ends of the first sides. The "predetermined occupied area" may be defined as a sum of areas of at least some top wiring patterns 125TP disposed in the "predetermined reference region," among the top wiring patterns 125TP. For example, the predetermined occupied area refers to an area occupied by the top wiring patterns within a predetermined reference region, wherein the predetermined reference region may include an area occupied by the top wiring patterns and also an additional surrounding area. The above-described "predetermined reference region" and "predetermined occupied area" will be described in more detail with reference to FIGS. 2A to 2C.

In addition, within a predetermined reference region, a ratio of the area of each pair of pads (for example, a pair of first pads 132-1, pair or second pads 132-2, or pair of third pads 132-3) to their respective predetermined occupied area of the top wiring patterns 125TP may be about 0.5 or less, in detail, about 0.4 or less. For example, in some embodiments, the ratio may be about 0.2 or more to about 0.4 or less. When the ratio is greater than about 0.4, surface topology characteristics of the first insulating layer 131 surrounding the pads 132 may be deteriorated. When the ratio is less than about 0.2, an increase in process difficulty such as a decrease in alignment margin may occur.

As can be seen in FIG. 1, in some embodiments, a plurality of first pads 132-1, second pads 132-2, and third pads 132-3 may correspond to different types of pads (e.g., pads having different sizes and being associated with different types of connected top wiring patterns 125TP). In addition, the layout of the first through third pads may be arranged as depicted in FIG. 1. In this embodiment, for example, pairs of adjacent third pads 132-3 are arranged in two columns extending in the Y direction. Two groups of third pads 132-3 may respectively form the two columns. Between those two columns, groups of first pads 132-1 may be interspersed with groups of second pads 132-2. For example, two rows of first pads 132-1 may be arranged in the Y direction to extend in the X direction, and then two rows of second pads 132-2 may be arranged in the Y direction to also extend in the X direction. This pattern may repeat in the Y direction. Each row of first pads 132-1 may include, for example, two pairs of first pads 132-1, and each row of second pads 132-2 may include, for example, two pairs of second pads 132-2, though other arrangements may be used.

Hereinafter, area variation of the plurality of pads 132 depending on the predetermined occupied area of the top wiring patterns 125TP will be described with reference to FIGS. 2A to 3C.

Figure 2A:
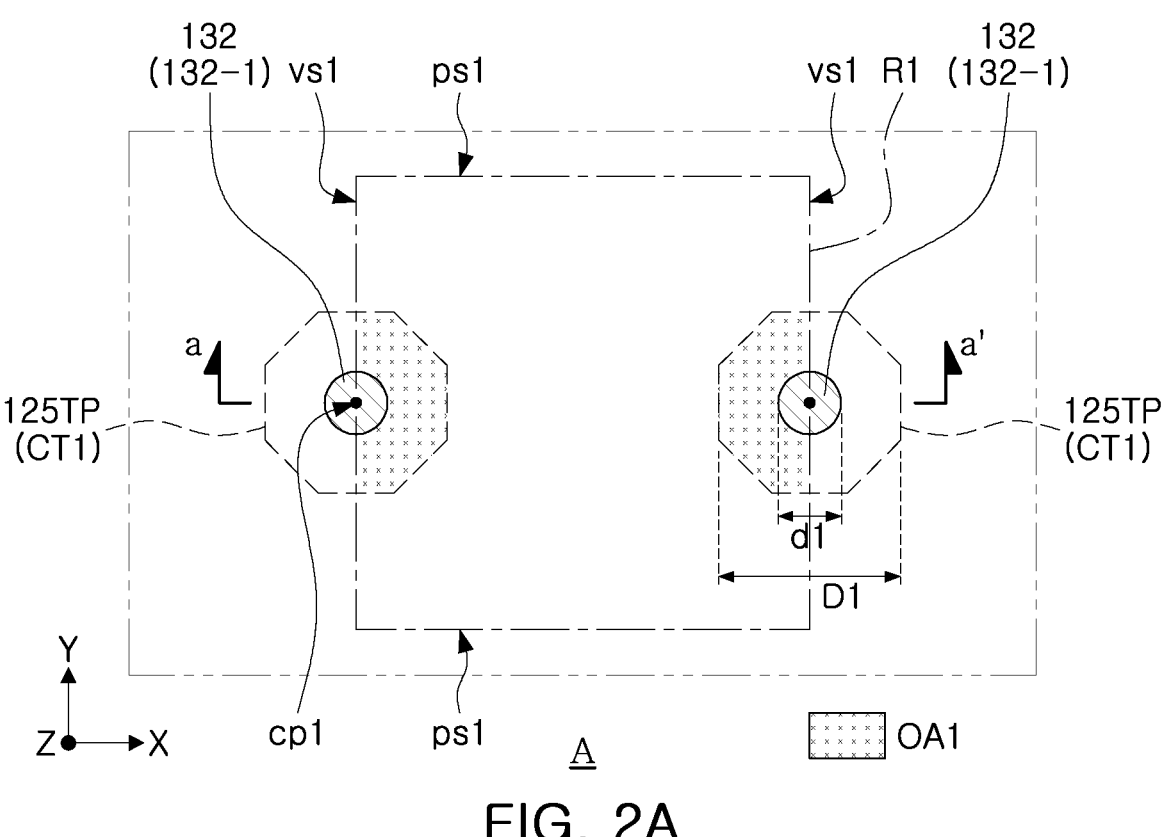
FIG. 2A is a partially enlarged view of region "A" of FIG. 1.
Figure 2B:
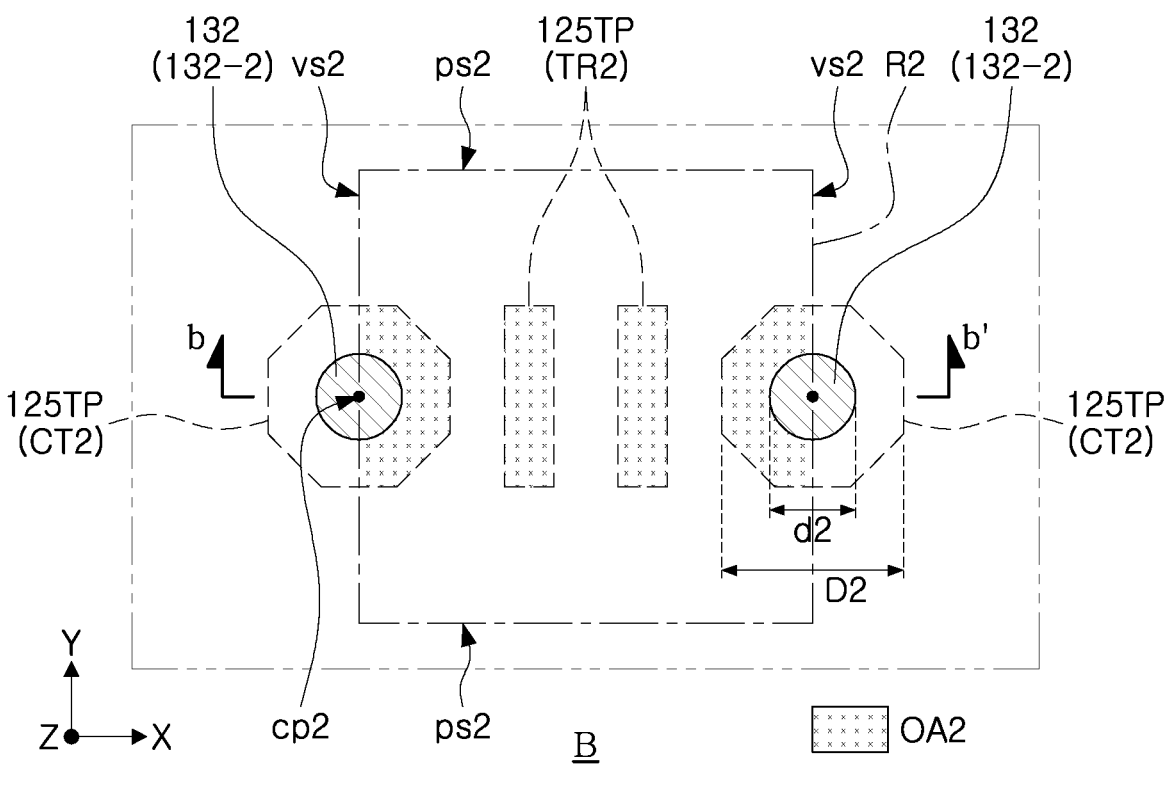
FIG. 2B is a partially enlarged view of region "B" of FIG. 1.
Figure 2C:
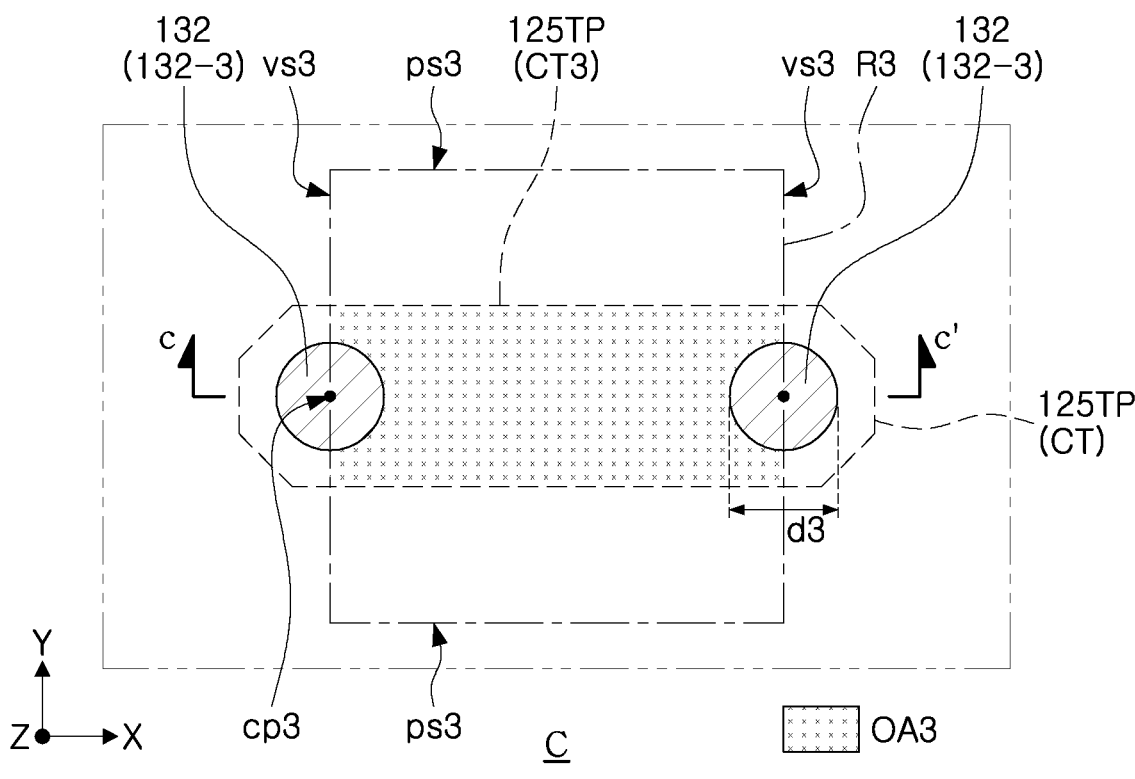
FIG. 2C is a partially enlarged view of region "C" of FIG. 1.

FIG. 2A is a partially enlarged view of region "A" of FIG. 1, FIG. 2B is a partially enlarged view of region "B" of FIG. 1, and FIG. 2C is a partially enlarged view of region "C" of FIG. 1.

FIG. 3A is a cross-sectional view taken along line a-a' of FIG. 2A, FIG. 3B is a cross-sectional view taken along line b-b' of FIG. 2B, and FIG. 3C is a cross-sectional view taken along line c-c' of FIG. 2C.

Referring to FIGS. 2A to 3C, the plurality of pads 132 may include a first group of first pads 132-1 adjacent to each other in a first direction (an X-direction), a second group of second pads 132-2 adjacent to each other in the first direction (the X-direction), and a third group of third pads 132-3 adjacent to each other in the first direction (the X-direction). For example, the first group of first pads 132-1 may include a plurality of rows of first pads, each row extending in the X direction and having at least a pair of adjacent first pads. The second group of second pads 132-2 may include a plurality of rows of second pads, each row extending in the X direction and having at least a pair of adjacent second pads. The third group of third pads 132-3 may include a plurality of rows of third pads, each row extending in the X direction and having at least a pair of adjacent third pads. The plurality of rows of the first and second pads 132-1 and 132-2 may correspond to the plurality of rows of the third pads 132-3.

The first wiring structure 125 may include a plurality of wiring patterns stacked in a vertical direction (a Z-direction), perpendicular to the front surface FR of the first substrate 110. The plurality of wiring patterns may include top wiring patterns 125TP adjacent to the plurality of pads 132 in the vertical direction (the Z-direction).

The plurality of pads 132 and the top wiring patterns 125TP may be covered with the first insulating layer 131. A capping barrier layer 124 may be disposed between the first insulating layer 131 and the top wiring patterns 125TP.

FIGS. 2A to 2C illustrate only an example of the arrangement of the top wiring patterns 125TP to describe the area variation of the plurality of pads 132 depending on the top wiring patterns 125TP, and the shape of the top wiring patterns 125TP is not limited to the shape depicted in FIGS. 2A to 2C.

FIG. 3A to 3C illustrate only a simplified example of the plurality of pads 132 to describe width or diameter variation of the plurality of pads 132 depending on the top wiring patterns 125TP, and a vertical cross-sectional shape of the plurality of pads 132 is not limited to the shape depicted in FIGS. 3A to 3C. For example, in each of the plurality of pads 132, a side surface may perpendicular to a top surface of the substrate 220 or may be inclined. Also, in some embodiments, a pad portion exposed to a bonding surface and a via portion contacting the top wiring patterns 125TP may be distinguished from each other, for example by having different shapes or sizes.

The components such as the first substrate 110, the first circuit layer 120, the individual devices 115, and the capping barrier layer 124 illustrated in FIGS. 3A to 3C have been described above with reference to FIG. 1, and thus redundant descriptions thereof will be omitted hereinafter.

As illustrated in FIGS. 2A and 3A, the top wiring patterns 125TP may include first contact patterns CT1, respectively contacting the first group of first pads 132-1 in the vertical direction (the Z-direction). The first contact patterns CT1 may have a first occupied area OA1 in a first region R1 between adjacent pads of the first group of first pads 132-1.

The first group of first pads 132-1 may provide a first bonding surface BS1 together with the first insulating layer 131.

The first region R1 may have at least a pair of first Y direction sides vs1, respectively passing through centers cp1 of the first group of first pads 132-1, and at least a pair of first X direction sides ps1 connecting ends of the pair of first Y direction sides vs1. The pair of first Y direction sides vs1 may be parallel to each other, and the pair of first X direction sides ps1 may be parallel to each other. In one embodiment, the pair of first Y direction sides vs1 and the pair of first X direction sides ps1 may have the same length. The centers of each side of the pair of first Y direction sides vs1 (e.g., in the Y direction) may respectively match centers cp1 of the first group of first pads 132-1, and the length of the first X direction sides ps1 may be equal to a distance in the X direction between the centers cp1 of adjacent pads of the first group of first pads 132-1.

The first occupied area OA1 may be equal to a sum of areas of part of each of the first contact patterns CT1, respectively connected to the first group of first pads 132-1. A ratio of a first area of the first group of first pads 132-1 to the first occupied area OA1 may be about 0.4 or less. The first occupied area OA1 may be smaller than a second occupied area OA2 and a third occupied area OA3 to be described later. Therefore, the first area of the first group of first pads 132-1 may be smaller than an area of each of the second group of second pads 132-2 and the third group of third pads 132-3.

For example, from a top-down view, for a given pair of first pads 132-1 adjacent to each other in the X direction and their corresponding contact patterns CT1, within a particular predetermined reference region such as described earlier, a first combined area occupied by the two first pads 132-1 may be about 0.4 (40%) or lower than a second combined area occupied by the respective corresponding contact patterns CT1.

As illustrated in FIGS. 2B and 3B, the top wiring patterns 125TP may include second contact patterns CT1, respectively contacting the second group of second pads 132-2 in the vertical direction (the Z-direction), and at least one trace pattern TR disposed between adjacent patterns of the second contact patterns CT1. The second contact patterns CT1 and the at least one trace pattern TR may have a second occupied area OA2 in a second region R2 between two adjacent pads of the second group of second pads 132-2. The trace pattern TR may not overlap the second group of second pads 132-2 (or any pads) in the vertical direction (the Z-direction). The second group of second pads 132-2 may provide a second bonding surface BS2 together with the first insulating layer 131.

The second region R2 may include at least a pair of second Y direction sides vs2, passing through centers cp2 of the second group of second pads 132-2, and at least a pair of second X direction sides ps2 connecting ends of the pair of second Y direction sides vs2. In this case, the pair of second Y direction sides vs2 and the pair of second X direction sides ps2 may have the same length. For example, the center of each side of the pair of second Y direction sides vs2 (e.g., in the Y direction) may respectively match the centers cp2 of the second group of second pads 132-2, and a length of the pair of second Y direction sides ps2 may be equal to a distance in the X direction between the centers cp2 of adjacent pads of the second group of second pads 132-2.

The second occupied area OA2 may be equal to a sum of areas of part of each of the second contact patterns CT2, respectively connected to two adjacent second pads 132-2 of the second group of second pads 132-2, and areas of at least some of the trace patterns TR extending between the second contact patterns CT2. Within a particular reference region, a ratio of a second area a pair of second pads 132-2 of the second group of second pads 132-2 to the second occupied area OA2 may be about 0.4 or less. The second occupied area OA2 may be larger than the above-described first occupied area OA1 and may be smaller than the third occupied area OA3 to be described later. Therefore, the second area of the second pads 132-2 may be larger than an area of the first pads 132-1 and may be smaller than the third pads 132-3.

For example, from a top-down view, within a particular predetermined reference region as described above, for a given pair of second pads 132-2 adjacent to each other in the X direction, and their corresponding contact patterns CT2 and trace patterns TR2, a first combined area occupied by the two second pads 132-2 may be about 0.4 or lower than a second combined area occupied by the respective corresponding contact patterns CT2 and trace patterns TR2. Thus, in one embodiment, each pair second pads 132-2 adjacent to each other in the X direction may have a plan view area that is 40% or less of the area of corresponding contact patterns CT2 and trace patterns TR2. Thus, in some embodiments, each first pad from the first group of first pads 132-1 has an area smaller than each second pad from the second group of second pads 132-2. At the same time, for a given predetermined reference region, each pair of first pads 132-1 may have a first area ratio in relation to its corresponding contact patterns CT1 and each pair of second pads 132-2 may have a second area ratio in relation to its corresponding contact patterns CT2 and trace patterns TR2. The first area ratio may be the same as the second area ratio, or a similar ratio (e.g., within a deviation of 10% or less).

As illustrated in FIGS. 2C and 3C, the top wiring patterns 125TP may include a single third contact pattern CT3 contacting the third group of third pads 132-3 in the vertical direction (the Z-direction). The single third contact pattern CT3 may have a third occupied area OA3 in the third region R3 between adjacent pads of the third group of third pads 132-3. The third contact pattern CT3 may extend in the first direction (the X-direction) between the adjacent pads of the third group of third pads 132-3. The third group of third pads 132-3 may provide a third bonding surface BS3 together with the first insulating layer 131.

The third region R3 may have at least a pair of third Y direction sides vs3, respectively passing through centers cp3 of the third group of third pads 132-3, and at least a pair of third X direction sides ps3 connecting ends of the pair of third Y direction sides vs3. The pair of third Y direction sides vs3 may be parallel to each other, and the pair of third X direction sides ps3 may be parallel to each other. In one embodiment, the pair of third Y direction sides vs3 and the pair of third X direction sides ps3 may have the same length. The centers of each side of the pair of third Y direction sides vs3 may respectively match the centers cp3 of the third group of third pads 132-3, and a length of the third X direction sides ps3 may be equal to a distance in the X direction between the centers cp3 of adjacent pads of the third group of third pads 132-3.

The third occupied area OA3 may be equal to an area of at least some of the third contact pattern CT3 connected to the third group of third pads 132-3. As an example, the third contact pattern CT3 may be a single pattern extending in a direction in which the third group of third pads 132-3 are spaced apart from each other. A ratio of a third area of the third group of third pads 132-3 to the third occupied area OA3 may be about 0.4 or less. The third occupied area OA3 may be larger than the above-described first occupied area OA1 and second occupied area OA2. Therefore, the third area of the third group of third pads 132-3 may be larger than an area of each of the first group of first pads 132-1 and the second group of second pads 132-2.

For example, from a top-down view, in a particular predetermined reference region, for a given pair of third pads 132-3 adjacent to each other in the X direction and their corresponding contact pattern CT3, a first combined area occupied by the two third pads 132-3 may be about 0.4 or lower than a second area occupied by the respective corresponding contact pattern CT3. Thus, in one embodiment, for a given reference region, each pair of third pads 132-3 adjacent to each other in the X direction may have a plan view area that is 40% or less of the area of corresponding a contact pattern CT3. Thus, in some embodiments, each second pad 132-2 has an area smaller than each third pad 132-3. At the same time, for the given predetermined reference region, each pair of second pads from the second group of second pads 132-2 may have a second area ratio in relation to its corresponding contact patterns CT2 and trace patterns TR2, and each pair of third pads from the third group of third pads 132-3 may have a third area ratio in relation to its corresponding contact pattern CT3. The second area ratio may be the same as the third area ratio, or a similar ratio (e.g., within a deviation of 10% or less).

As described above, the first pads 132-1, the second pads 132-2, and the third pads 132-3 may have different areas depending on the distribution of the top wiring patterns 125TP, respectively. For example, the first group of first pads 132-1, the second group of second pads 132-2, and the third group of third pads 132-3 may have first to third areas of about 0.4 or less compared with the three occupied areas OA1, OA2, and OA3, so that an effect of the first group of first pads 132-1, the second group of second pads 132-2, the third group of third pads 132-3 on the topology may be significantly reduced and a bonding surface having improved quality may be formed.

In the present embodiment, the first contact patterns CT1 and the second contact patterns CT2 have the same area, but the second occupied area OA2 may be larger than the first occupied area OA1 due to the trace patterns TR disposed in the second region R2. Accordingly, a first area of each first pad 132-1 corresponding to the first occupied area OA1 may be smaller than a second area of each second pad 132-2 corresponding to the second occupied area OA2.

As described above, the first group of first pads 132-1 may be formed to have an area smaller than an area of the second group of second pads 132-2, and thus an area of the first contact patterns CT1 surrounding a periphery of the first group of the first pads 132-1 may be increased compared to the area of the second contact patterns CT2 that surrounds a periphery of the second group of second pads 132-2. For example, a first maximum width D1 of each first contact pattern CT1 may be substantially the same as a second maximum width D2 of each second contact pattern CT2, and a first width d1 of each first pad 132-1 may be smaller than a second width d2 of each second pad 132-2. An area of a first overlapping region ds1 of the first insulating layer 131 and the first contact pads CT1 may be larger than an area of a second overlapping region ds2 of the first insulating layer 131 and the second contact pads CT2. Accordingly, when a polishing process (for example, a chemical mechanical polishing (CMP) process) is applied, flatness may be improved (for example, dishing may be reduced) in the first overlapping region ds1 around the first contact patterns CT1, and surface topology characteristics between the first group of first pads 132-1 may be improved. This will be described later with reference to FIG. 4A.

The second group of second pads 132-2 may be formed to have a relatively large area, but may have a second area of about 0.4 or less compared with the second occupied area OA2 to significantly reduce an effect on the topology. In addition, flatness between the second group of second pads 132-2 may be improved by the trace patterns TR disposed between the second contact patterns CT2, and surface topology characteristics may be improved.

In the present embodiment, the third contact pattern CT3 may be formed to have a larger area than the first contact patterns CT1 and the second contact patterns CT2. The third occupied area OA3 of the third contact patterns CT3 may be larger than the second occupied area OA2. Accordingly, the third area of the third group of third pads 132-3 corresponding to the third occupied area OA3 may be larger than the second area of the second group of second pads 132-2 corresponding to the second occupied area OA2.

Although the third group of third pads 132-3 are formed to have a relatively large area, the third group of third pads 132-3 may have a third area of about 0.4 or less as compared with the third occupied area OA3 to significantly reduce an effect on the topology. In addition, the flatness between the third group of third pads 132-3 may be improved by the third contact pattern CT3, and surface topology characteristics may be improved. In this case, the first contact patterns CT1 and the second contact patterns CT2 may include a terminal for a signal and the third contact pattern CT3 may be a terminal for power and a terminal for grounding or a dummy pattern, but example embodiments are not limited thereto.

Hereinafter, surface topology characteristics of first to third bonding surfaces BS1, BS2, and BS3 based on a difference between an occupied area of the top wiring patterns 125TP and the area of the plurality of pads 132 will be described with reference to FIGS. 4A to 4C.

Figure 4A:
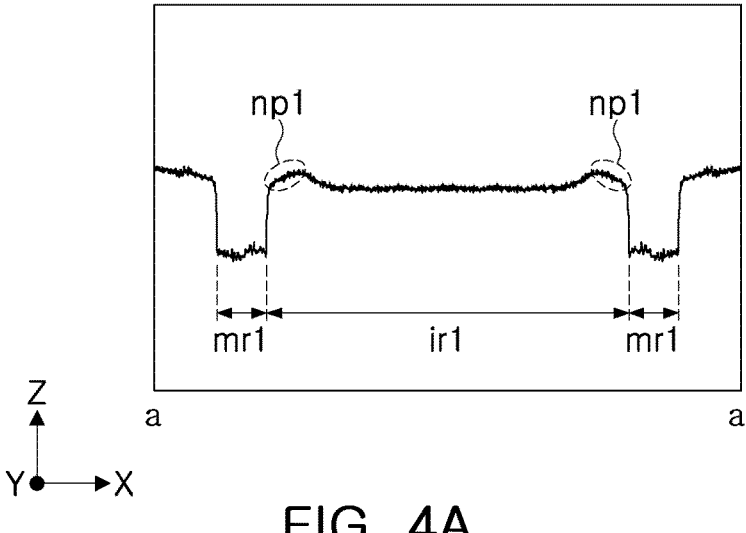
FIG. 4A is a diagram illustrating a surface topology of a first bonding surface of FIG. 3A.
Figure 4B:
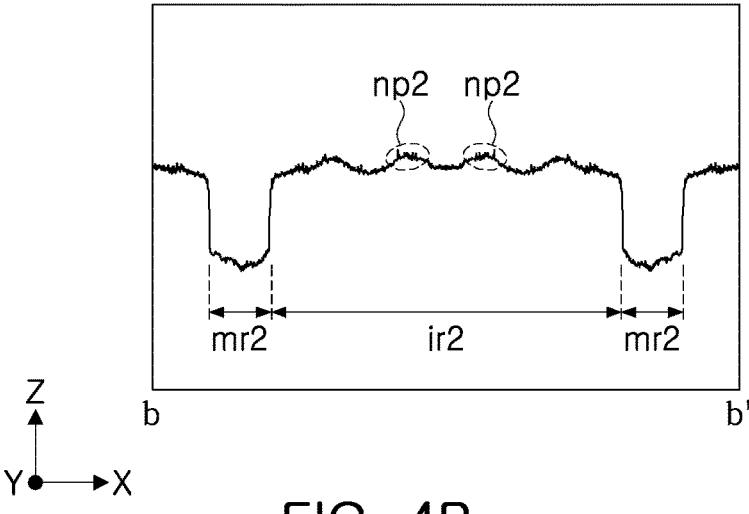
FIG. 4B is a diagram illustrating a surface topology of a second bonding surface of FIG. 3B.
Figure 4C:
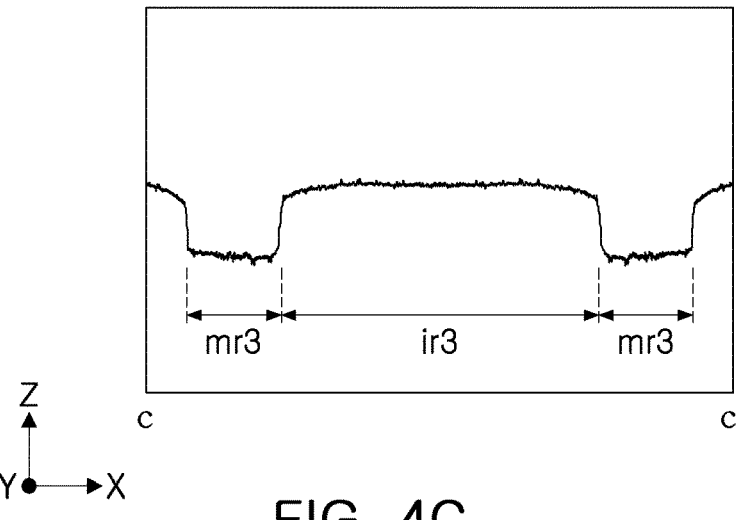
FIG. 4C is a diagram illustrating a surface topology of a third bonding surface of FIG. 3C.

FIG. 4A is a diagram illustrating a surface topology of a first bonding surface BS1 of FIG. 3A, FIG. 4B is a diagram illustrating a surface topology of a second bonding surface BS2 of FIG. 3B, and FIG. 4C is a diagram illustrating a surface topology of a third bonding surface BS3 of FIG. 3C. FIGS. 4A to 4C illustrate results of scanning the surface topology of the first insulating layer 131 in FIGS. 3A to 3C using an atomic force microscope (AFM), respectively.

Referring to FIGS. 3A and 4A, a first insulating layer region ir1 represents a first topology of the first insulating layer 131 between adjacent pads of the first group of first pads 132-1. The first topology shows that a height of a top surface may be increased in a direction toward pads of the first group of first pads 132-1, and may then be decreased with a pad region mr1. In the present embodiment, the first area of the first group of first pads 132-1, for example, a width of the first pad region mr1 may be reduced to prevent topology from sharply decreasing at a first point np1. Accordingly, flatness around the first pad region mr1 may be improved, and topological characteristics may be improved.

Referring to FIGS. 3B and 4B, a second insulating layer region ir2 represents a second topology of the first insulating layer 131 between adjacent pads of the second group of second pads 132-2. The second topology repeats may be repeatedly increased and decreased between the first pads 132-2 of the second group, and may then be sharply decreased at a boundary of the second group of second pads 132-2. In the present embodiment, although the second area of the second group of second pads 132-2, for example, a width of the second pad region mr2 is greater than a width of the first pad region mr1, the topology indicates that a height may be increased again at a second point np2 between adjacent pads of the second group of second pads 132-2 by the trace pattern TRs. Accordingly, flatness between the second group of first pads 132-2 may be improved, and topology characteristics may be improved.

Referring to FIGS. 3C and 4C, a third insulating layer region ir3 represents a third topology of the first insulating layer 131 between adjacent pads of the third group of third pads 132-3. The third topology may be gently maintained without a sharp change between adjacent pads of the third group of third pads 132-3. In the present embodiment, although a third area of the third group of third pads 132-3, for example, a width of the third pad region mr3 may be largest compared to the first pad region mr1 and the second pad region mr2, a topology between adjacent pads of the third group of third pads 132-3 may be maintained at a constant level by the third contact pad CT3 having a large area.

Hereinafter, topological characteristics of a comparative example will be described with reference to FIGS. 5A and 5B.

Figure 5A:
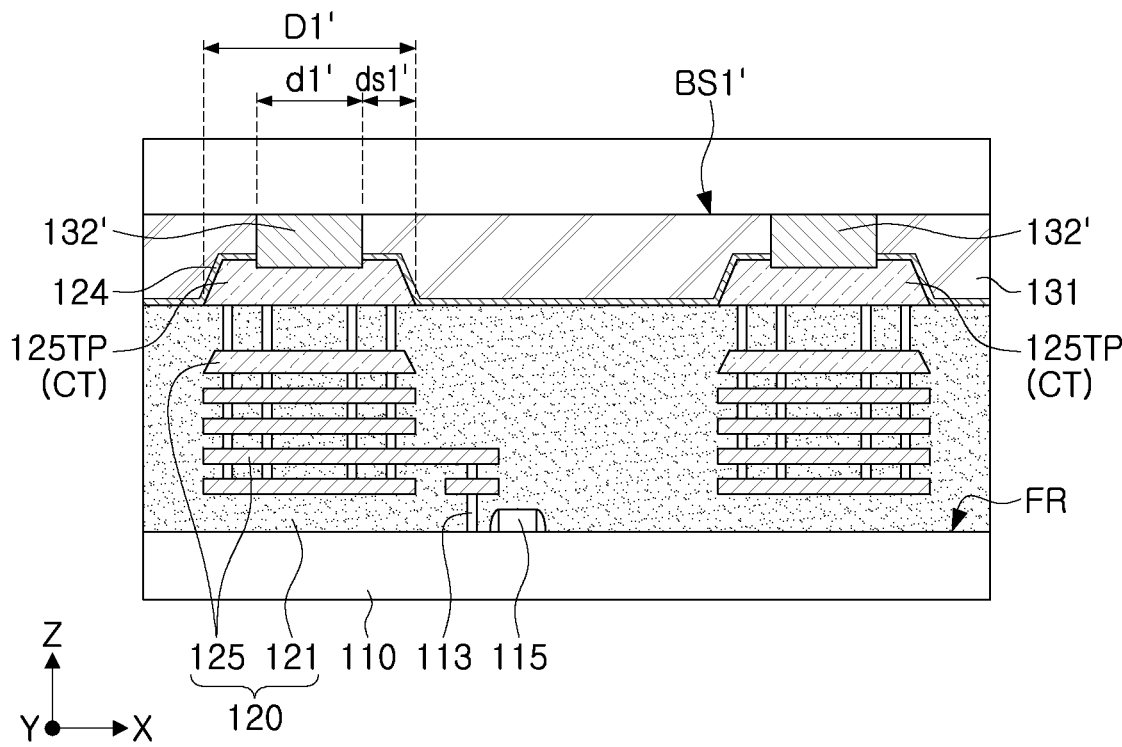
FIG. 5A is a cross-sectional view illustrating a region of a comparative example corresponding to FIG. 3A.
Figure 5B:
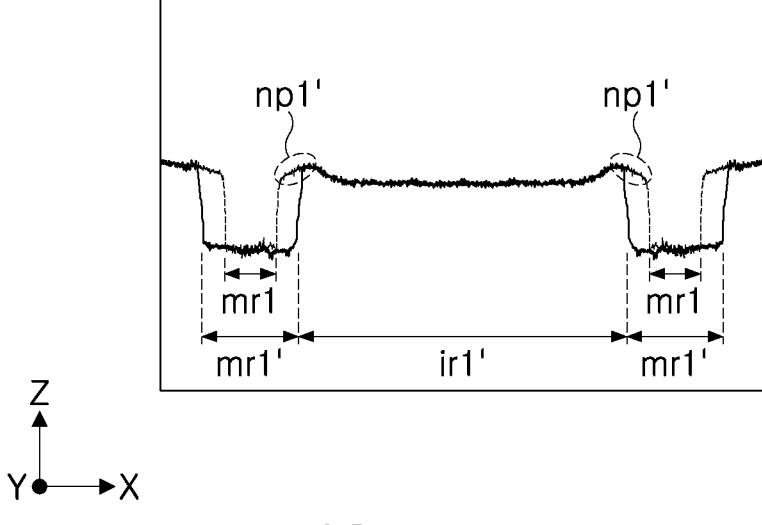
FIG. 5B is a diagram illustrating a surface topology of a bonding surface of FIG. 5A.

FIG. 5A is a cross-sectional view illustrating a region of a comparative example corresponding to FIG. 3A, and FIG. 5B is a diagram illustrating a surface topology of a bonding surface of FIG. 5A.

Referring to FIG. 5A, pads 132' in the comparative example may have a width d1', greater than a first width d1 of the first group of first pads 132-1 according to the example embodiment. An area of an overlapping region ds1' in the comparative example may be smaller than an area of the overlapping region ds1 of the example embodiment. In this case, a topology of a bonding surface BS1' in the comparative example may sharply protrude around the pads 132' in the comparative example.

Referring to FIG. 5B, an insulating layer region ir1' in the comparative example represents a topology of a first insulating layer 131 between the first pads 132' in the comparative example. The topology of the comparative example may have a shape, similar to a shape of the first topology of the example embodiment. However, the first topology of the example embodiment may be gently decreased to the first pad region mr1, whereas the topology of the comparative example may be sharply decreased on a boundary between the pad region mr1' and the insulating layer region ir1', which causes flatness of a bonding surface BS1' to be reduced.

Figure 6A:
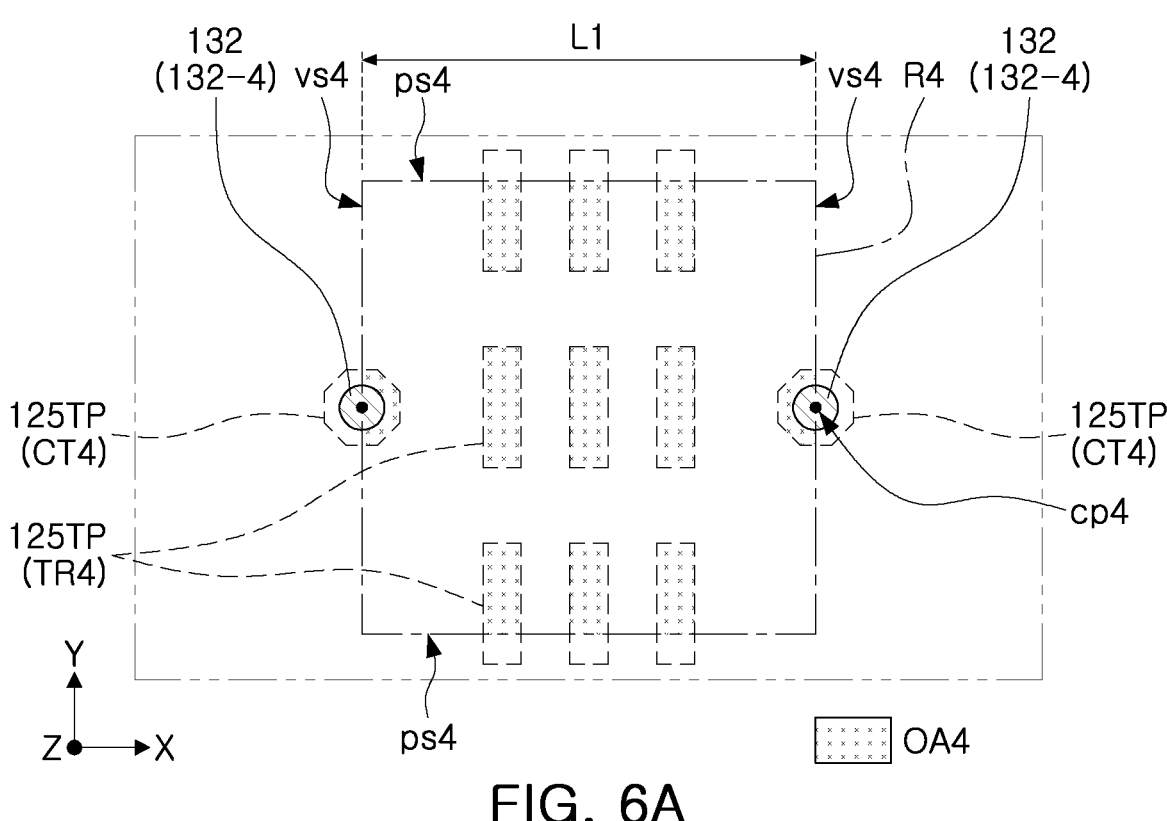
FIGS. 6A and 6B are plan views illustrating modified examples of components illustrated in FIG. 2B, respectively.
Figure 6B:
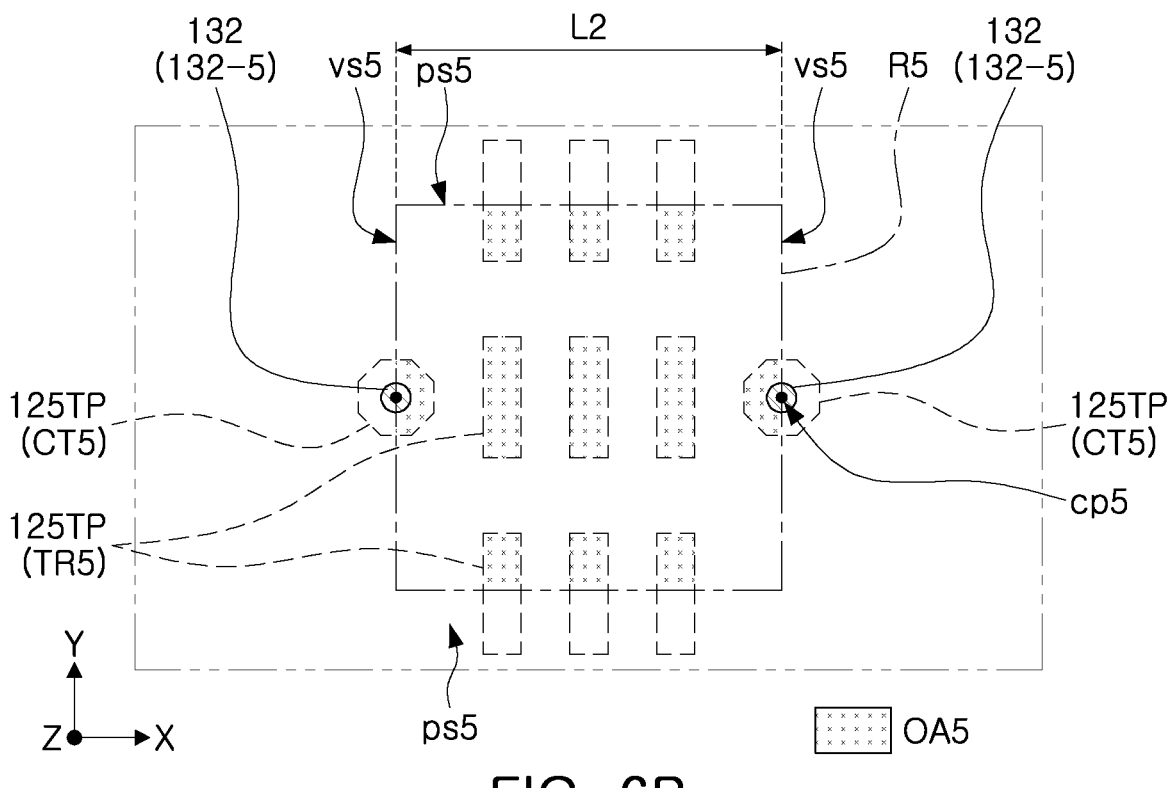

FIGS. 6A and 6B are plan views illustrating modified examples of components illustrated in FIG. 2B, respectively. FIG. 6A illustrates an area and number of top wiring patterns 125TP, different from those of FIG. 2A. FIG. 6B illustrates a narrower distance between pads 132, as compared with that in FIG. 6A.

Referring to FIG. 6A, in a modified example, the top wiring patterns 125TP may include fourth contact patterns CT4, respectively contacting fourth group of first pads 132-4 in a vertical direction (a Z-direction), and at least one first trace pattern TR4 disposed between the fourth contact patterns CT4.

The fourth contact patterns CT4 and the at least one first trace pattern TR4 may have a fourth occupied area OA4 in a fourth region R4 between adjacent pads of the fourth group of pads 132-4. The fourth region R4 may have at least a pair of Y direction sides vs4, respectively passing through centers cp4 of the fourth group of pads 132-4, and at least a pair of X direction sides ps4 connecting ends of the pair of fourth Y direction sides vs4 to each other. In this case, lengths of the pair of Y direction sides vs4 and the pair of fourth X direction sides ps4 may be the same.

An area of the fourth contact patterns CT4 may be smaller than an area of the second contact patterns CT2 illustrated in FIG. 2B, but an area of the first trace pattern TR4 may be increased to be larger than the area of the trace patterns TR of FIG. 2B, and thus a fourth occupied area OA4 may not be significantly reduced as compared with the second occupied area OA2. As a result, the fourth area of the fourth group of pads 132-4 may not be reduced as compared with the second area of the second group of second pads 132-2 of FIG. 2B.

Referring to FIG. 6B, in a modified example, top wiring patterns 125TP may include fifth contact patterns CT5, respectively contacting a fifth group of pads 132-5 in a vertical direction (a Z-direction), and at least one second trace pattern TR5 disposed between the fifth contact patterns CT5.

The fifth contact patterns CT5 and the at least one second trace pattern TR5 have a fifth occupied area OA5 in a fifth region R5 between the fifth group of pads 132-5. The fifth region R5 may include at least a pair Y direction sides vs5, respectively passing through centers cp5 of the fifth group of pads 132-5, and at least a pair of X direction sides ps5 connecting ends of the at least a pair of Y direction sides vs5. In this case, lengths of the pair of fifth Y direction sides vs5 and the at least a pair of X direction sides ps5 may be the same.

A distance L2 between centers cp5 of adjacent pads of the fifth group of pads 132-5 is smaller than a distance L1 between the centers cp4 of the fourth group of pads 132-4.

Accordingly, an area of the second trace patterns TR5 in the fifth region R5 may be reduced as compared with the area of the first trace patterns TR4 in the fourth region R4, and the fifth occupied area OA5 may be smaller than the occupied area OA4. As a result, although the area of the fourth contact patterns CT4 and the area of the fifth contact patterns CT5 are the same, the fifth area of the fifth group of pads 132-5 may be smaller than the fourth area of the fourth group of pads 132-4.

Figure 7:
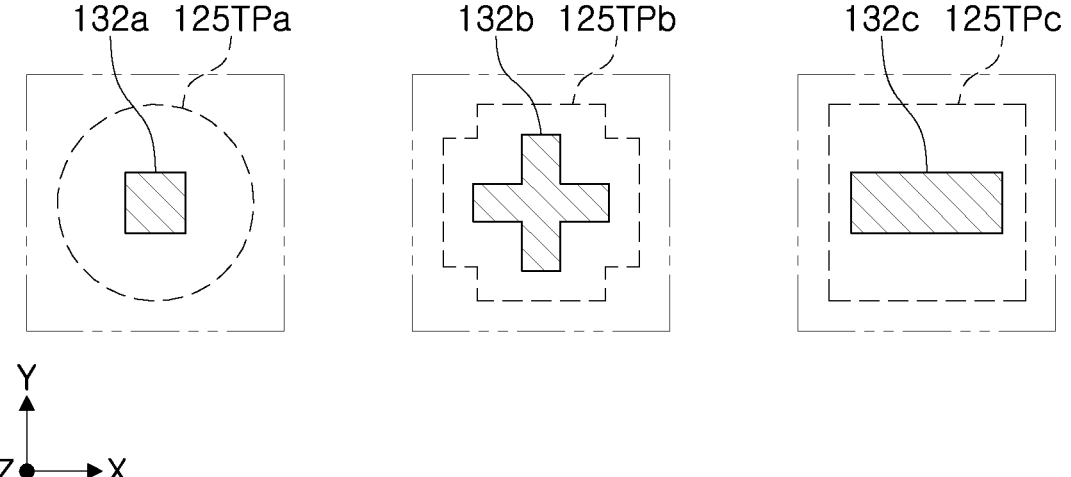
FIG. 7 is a plan view illustrating modified examples of some components illustrated in FIG. 1.

FIG. 7 is a plan view illustrating modified examples of some components illustrated in FIG. 1. FIG. 7 illustrates a planar shape of top wiring patterns 125TP and a plurality of pads 132.

Referring to FIG. 7, in a first modified example, a pad 132a, which may correspond to any of pads 132-1, 132-2, or 132-3, may be formed to have a rectangular shape, and a top wiring pattern (a contact pattern) 125TPa may be formed to have an oval or circular shape. In a second modified example, the pad 132b, which may correspond to any of pads 132-1, 132-2, or 132-3, may be formed to have a cross shape, and a top wiring pattern 125TPb (contact pattern) may be formed to have a cross shape corresponding thereto. In a third modified example, a pad 132c, which may correspond to any of pads 132-1, 132-2, or 132-3, may be formed to have a rectangular shape, and a top wiring pattern (contact pattern) 125TPc may be formed to have a rectangular shape. As described above, the planar shapes of the top wiring patterns 125TP and the plurality of pads 132 introduced in example embodiments may vary and are not limited to shapes and combinations illustrated in the drawings.

Figure 8:
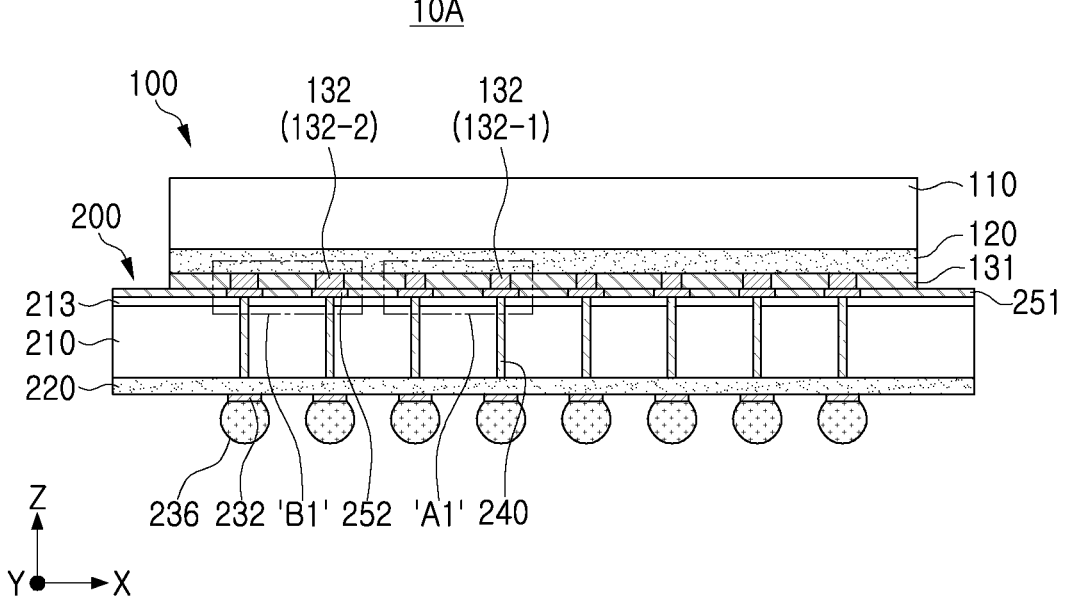
FIG. 8 is a cross-sectional view of a semiconductor package according to an example embodiment.
Figure 9A:
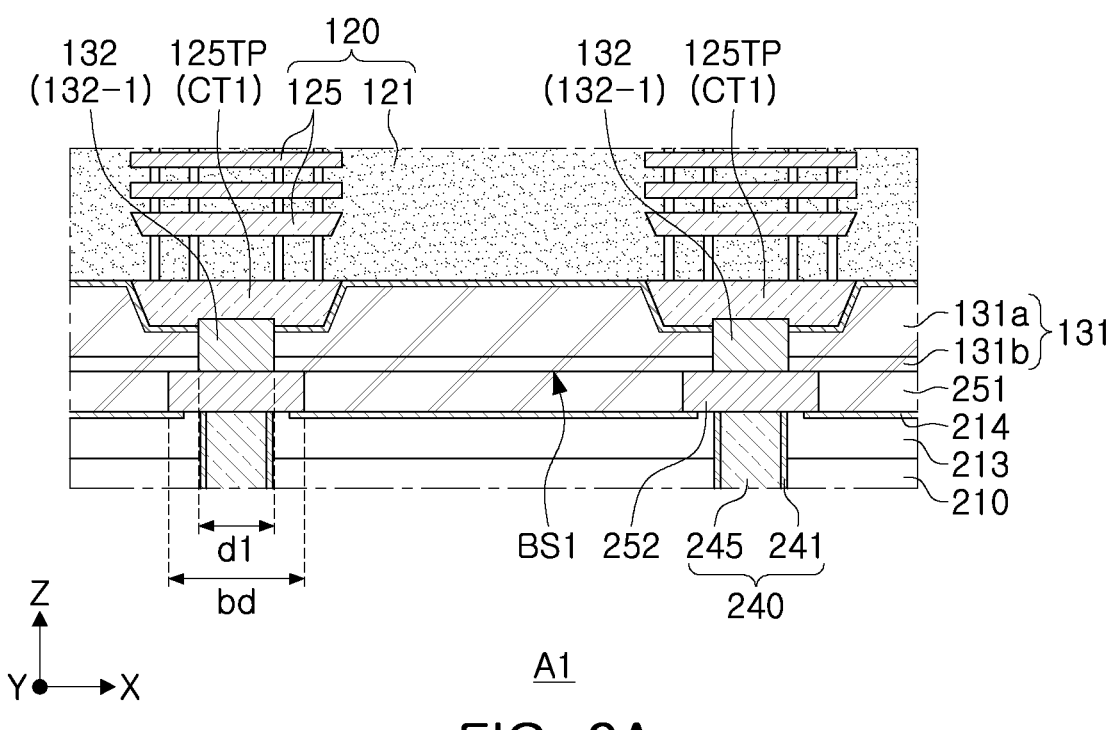
FIG. 9A is a partially enlarged view of region "A1" of FIG. 8.
Figure 9B:
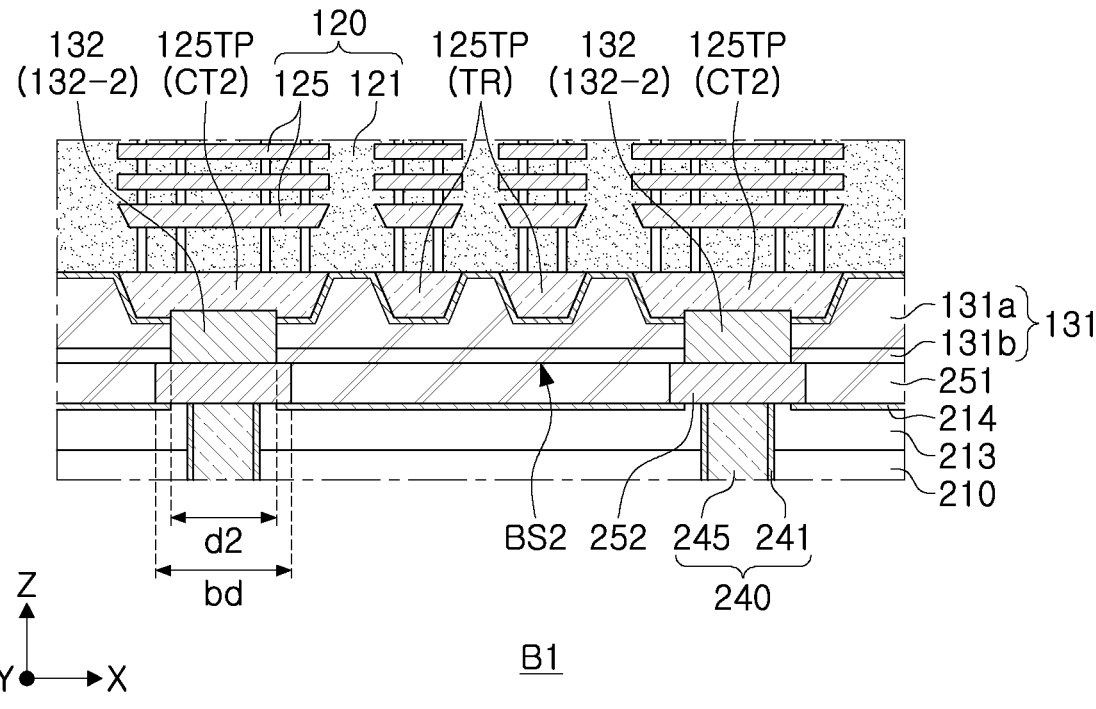
FIG. 9B is a partially enlarged view of region "B1" of FIG. 8.

FIG. 8 is a cross-sectional view of a semiconductor package according to an example embodiment. FIG. 9A is a partially enlarged view of region "A1" of FIG. 8, FIG. 9B is a partially enlarged view of region "B1" of FIG. 8, and FIG. 9C is a partially enlarged view of region of an example embodiment corresponding to FIG. 9A.

Figure 9C:
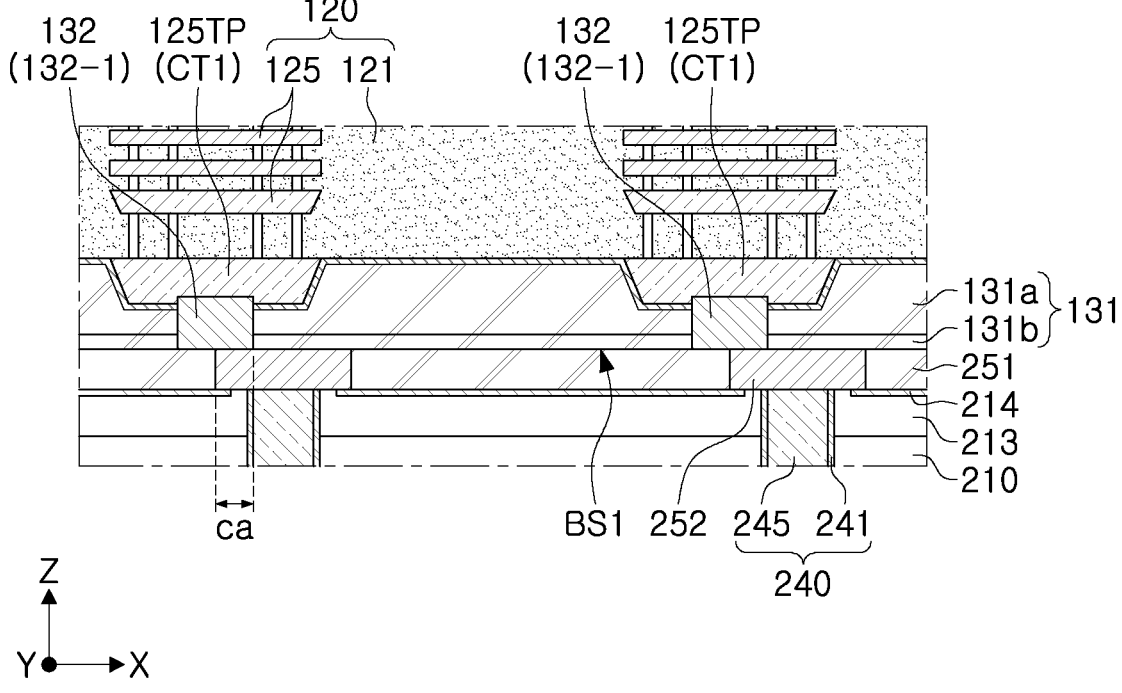
FIG. 9C is a partially enlarged view of region of an example embodiment corresponding to FIG. 9A.

Referring to FIGS. 8 to 9C, a semiconductor package 10A according to an example embodiment may have features the same as or similar to those described with reference to FIGS. 1 to 7, except that semiconductor package 10A further includes a second semiconductor chip 200. The first semiconductor chip 100 and the second semiconductor chip 200 may be directly bonded without a connection member such as a metal bump. At least one first semiconductor chip 100 may be mounted on the second semiconductor chip 200. For ease of description, the first semiconductor chip 100 of FIG. 8 is illustrated as including only a first group of first pads 132-1 and a second group of second pads 132-2, the first semiconductor chip 100 may be understood as including the components and features described with reference to FIGS. 1 to 7.

According to example embodiments, at least one first semiconductor chip 100 mounted on the second semiconductor chip 200 may include chiplets constituting a multi-chip module (MCM).

According to example embodiments, the second semiconductor chip 200 may be a buffer chip or a control chip including a plurality of logic devices and/or memory devices. The second semiconductor chip 200 may transmit a signal from the first semiconductor chip 100 stacked thereon to an external entity, and may also transmit a signal and power from an external entity to the first semiconductor chips 100. The plurality of second semiconductor chips 200A, 200B, 200C, and 200D may be memory chips including volatile memory devices such as a DRAM and an SRAM or nonvolatile memory devices such as a PRAM, an MRAM, an FeRAM, or an RRAM.

The second semiconductor chip 200 may include a second substrate 210, second through-electrodes 240, a second insulating layer 251, and a plurality of pads 252. The second semiconductor chip 200 may have a bonding surface provided by an upper surface of the second insulating layer 251 and an upper surface of the pads 252. Since the first semiconductor chip 100 and the second semiconductor chip 200 may include the same or similar components, the same or similar components are denoted by the same or similar reference numerals, and repeated description of the same components will be omitted. For example, it may be understood that the second substrate 210 and the second circuit layer 220 have substantially the same characteristics as the above-described first substrate 110 and the first circuit layer 120. Hereinafter, to distinguish locations of components in the second semiconductor chip 200, a "second insulating layer" may be referred to as a "second upper insulating layer" or a "second rear insulating layer," and a "pad" may be referred to as an "upper pad" or a "rear pad." Pads 232 of the first semiconductor chip 100 may be described as "lower" pads 232.

The second through-electrode 240 may penetrate through the second substrate 210 and the insulating protective layer 213 to electrically connect the upper pad 252 and the lower pad 232 to each other. The second through-electrode 240 may include a via plug 245 and a side barrier layer 241 surrounding side surfaces of the via plug 245. The via plug 245 may include or be formed of, for example, tungsten (W), titanium (Ti), aluminum (Al), or copper (Cu), and may be formed by a plating process, a physical vapor deposition (PVD) process, or a chemical vapor deposition (CVD) process. A side insulating layer, not illustrated, including or formed of an insulating material (for example, a high aspect ratio process (HARP) oxide) such as a silicon oxide, a silicon nitride, or a silicon oxynitride, may be formed between the side barrier layer 241 and the second substrate

210. The insulating protective layer 213 may include or be formed of, for example, a silicon oxide (SiO), a silicon nitride (SiN), a silicon carbide (SiC), a silicon oxynitride (SiON), or a silicon carbonitride (SiCN). A buffer layer 214 such as a polishing-stop layer or a barrier may be disposed on an upper surface of an insulating protective layer 213. For example, the buffer layer 214 may include or be formed of a silicon nitride, a silicon carbide, a silicon oxynitride, or a silicon carbonitride.

The second insulating layer 251 may be disposed on the second substrate 210. The second insulating layer 251 may include or be formed of an insulating material which may be bonded and coupled to the first insulating layer 131 of the first semiconductor chip 100. For example, the second insulating layer 251 may include silicon oxide (SiO) or silicon carbonitride (SiCN). The second insulating layer 251 may be formed to surround the plurality of upper pads 252. The second insulating layer 251 may provide a bonding surface together with the plurality of upper pads 252. In example embodiments, the first insulating layer 131 may include a lower insulating layer 131*b*, contacting the second insulating layer 251, and an upper insulating layer 131*a* disposed on the lower insulating layer 131*b*. In this case, the second insulating layer 251 and the lower insulating layer 131*b* may include different types of insulating material to improve the bonding strength between the second insulating layer 251 and the lower insulating layer 131*b*. For example, the lower insulating layer 131*b* may include or be a silicon carbonitride (SiCN), and the upper insulating layer 131*a* and the second insulating layer 251 may include or be a silicon oxide (SiO).

The upper pads 252 may be disposed on a rear surface of the second substrate 210, and may be bonded to at least a portion of the pads 132 to physically and electrically connect the first semiconductor chip 100 and the second semiconductor chip 200 to each other. The upper pads 252 may include or be formed of at least one of, for example, copper (Cu), nickel (Ni), gold (Au), silver (Ag), titanium (Ti), titanium nitride (TiN), tantalum (Ta), or tantalum nitride (TaN).

An area of the upper pads 252 may be larger than a first area of a first group of first pads 132-1 and may be larger than a second area of a second group of second pads 132-2. For example, a width bd of the upper pads 252 may be greater than a first width d1 of the first group of first pads 132-1 and greater than a second width d2 of the second group of second pads 132-2. A contact area between the plurality of pads 132 and the upper pads 252, corresponding to each other, may be about 50% or more of an area of each of the plurality of pads 132.

For example, as illustrated in FIG. 9C, a contact area "ca" between the first group of first pads 132-1 and the plurality of pads 252, contacting each other, may be about 50% or more of the first area of the first group of first pads 132-1, but example embodiments are not limited thereto.

In addition, a lower pad 232 electrically connected to a wiring structure, not illustrated, may be disposed below the second circuit layer 220. The lower pad 232 may be a pad structure electrically connected to the wiring structure, not illustrated. A connection bump 236 may be disposed below the lower pad 232. The connection bump 236 may be, for example, a conductive bump structure including a solder ball or a copper (Cu) post.

Figure 10:
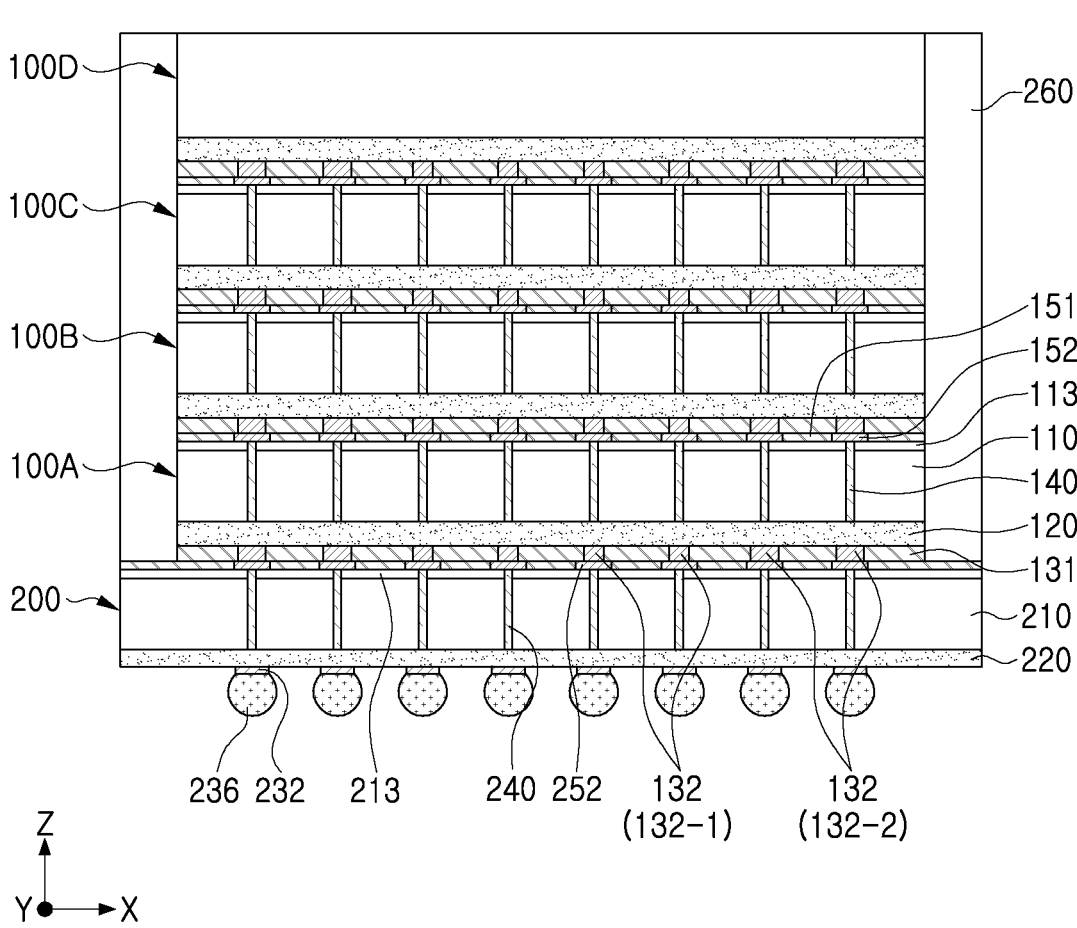
FIG. 10 is a cross-sectional view of a semiconductor package according to an example embodiment.

FIG. 10 is a cross-sectional view of a semiconductor package 10B according to an example embodiment.

Referring to FIG. 10, a semiconductor package 10B according to an example embodiment may have features the same as or similar to those described with reference to FIGS. 1 to 9C except that the semiconductor package 10B includes a plurality of first semiconductor chips 100A, 100B, 100C, and 100D, stacked on a second semiconductor chip 200 in a vertical direction (a Z-axis direction), and a molding member 260.

Each of the plurality of first semiconductor chips 100A, 100B, 100C, and 100D may include a plurality of first front pads 132 having different areas depending on top wiring patterns, for example, a first group of first front pads 132-1 and a second group of first front pads 132-2 as described previously.

The plurality of first semiconductor chips 100A, 100B, and 100C may further include first rear pads 152 and a first through-electrode 140 for forming an electrical interconnect path. However, the first semiconductor chip 100D disposed on a top level may not include the first through-electrode 140 and the first rear pads 152, and may have a relatively large thickness.

According to example embodiments, a fewer or greater number of semiconductor chips than illustrated in the drawing may be stacked on the second semiconductor chip 200. For example, three or less or five or more first semiconductor chips may be stacked on the second semiconductor chip 200.

Bonding interfaces, at which the first rear insulating layer 151 and the first front insulating layer 131 are bonded to each other and the first rear pads 152 and the first front pads 132 are bonded to each other, may be disposed between the plurality of first semiconductor chips 100A, 100B, 100C, and 100D. The plurality of first semiconductor chips 100A, 100B, 100C, and 100D may be electrically connected to each other by the first rear pads 152 and the first front pads 132 bonded to each other. Among the plurality of first semiconductor chips 100A, 100B, 100C, and 100D, the bottom first semiconductor chip 100A may be electrically connected to the second semiconductor chip 200 by the first front pads 132 and the second rear pads 252 of the second semiconductor chip 200 bonded to each other.

The molding member 260 may be disposed on the second semiconductor chip 200 and may seal at least a portion of each of the plurality of first semiconductor chips 100A, 100B, 100C, and 100D. The molding member 260 may be formed to expose an upper surface of the first semiconductor chip 100D disposed on a top level. According to example embodiments, the molding member 160 may be formed to cover the upper surface of the first semiconductor chip 100D disposed on the top level. The molding member 160 may include, for example, an epoxy molding compound (EMC), but a material of the molding member 160 is not limited thereto.

Figure 11A:
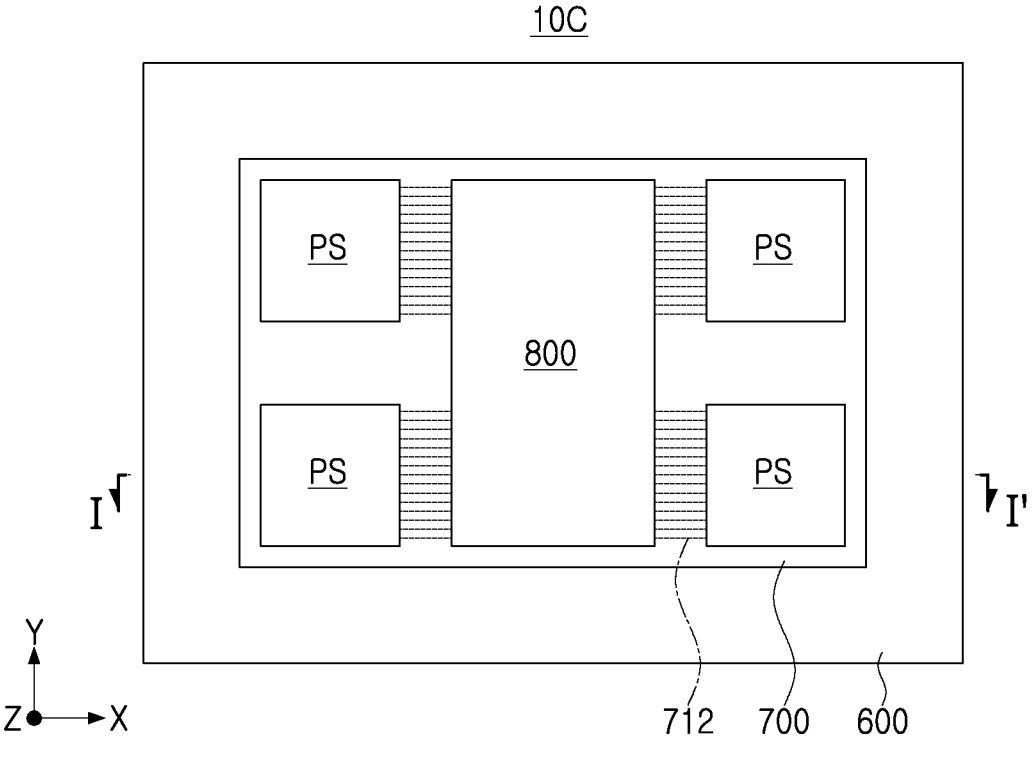
FIG. 11A is a plan view of a semiconductor package according to an example embodiment.
Figure 11B:
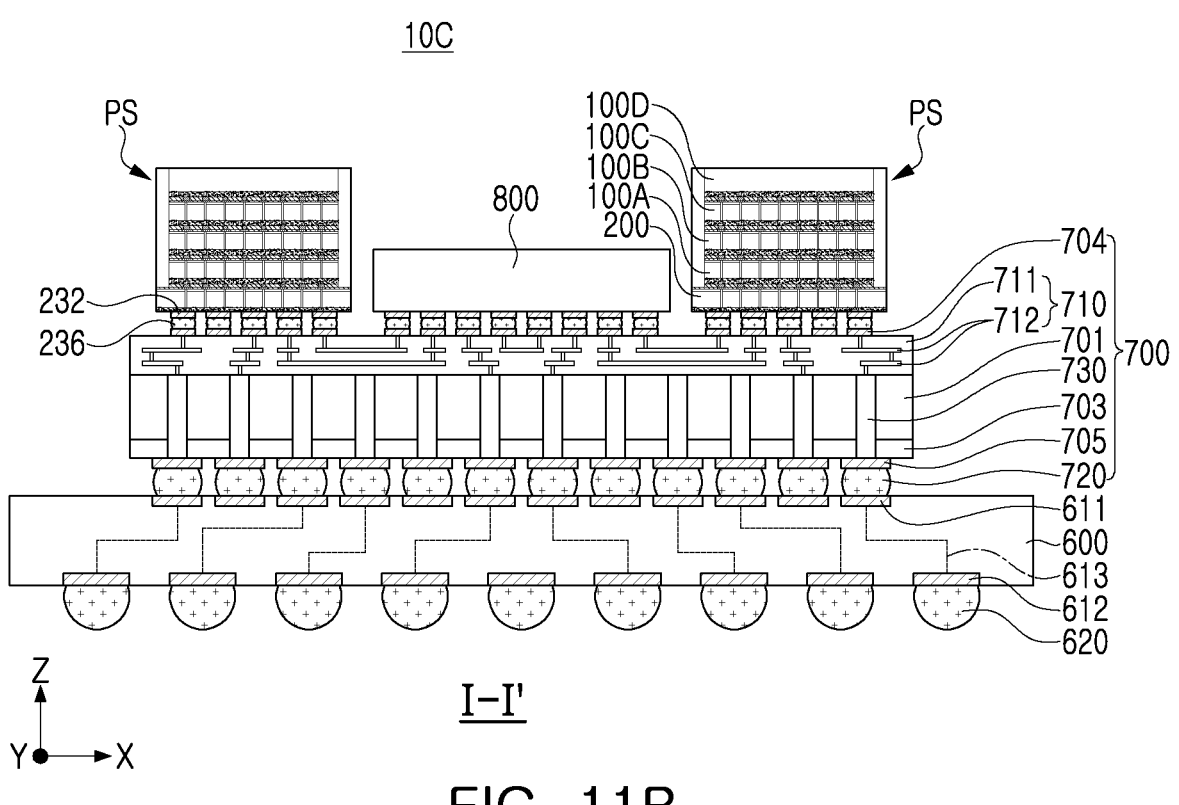
FIG. 11B is a cross-sectional view taken along line I-I' of FIG. 11A.

FIG. 11A is a plan view of a semiconductor package 10C according to an example embodiment, and FIG. 11B is a cross-sectional view taken along line I-I' of FIG. 11A.

Referring to FIGS. 11A to 11B, the semiconductor package 10C according to an example embodiment may include a package substrate 600, an interposer substrate 700, and at least one package structure PS. The semiconductor package 10C may further include a logic chip (or a processor chip) 800 disposed to be adjacent to the package structure PS on the interposer substrate 700. The package structure PS may have features the same as or similar to those of the semiconductor packages 10, 10A, and 10B described with reference to FIGS. 1A to 10. The package structure PS is illustrated in the form of the semiconductor package 10A of FIG. 10, but example embodiments are not limited thereto.

The package substrate 600 may be a support substrate on which the interposer substrate 700, the logic chip 800, and the package structure PS are mounted, and may be a semiconductor package substrate including a printed circuit board (PCB), a ceramic substrate, a glass substrate, a tape wiring board, or the like. The package substrate 600 may include lower pads 612, upper pads 611, and a wiring circuit 613 electrically connecting the lower pads 612 and the upper pads 611 to each other. A body of the package substrate 600 may include different materials depending on the type of the substrate. For example, when the package substrate 600 is a printed circuit board, the package substrate 600 may have a form in which a wiring layer is additionally laminated on one side or both sides of a body copper clad laminate or a copper clad laminate. The upper pads 611, the lower pads 612, and the wiring circuit 613 may form an electrical path connecting a lower surface and an upper surface of the package substrate 600 to each other. An external connection bump 620 connected to each lower pad 612 may be disposed on the lower surface of the package substrate 600. The external connection bumps 620, described generally as an external connection terminal, may include or may be, for example, solder balls.

The interposer substrate 700 may include a substrate 701, a lower protective layer 703, lower pads 705, an interconnect structure 710, conductive bumps 720, and through-vias 730. The package structure PS and the processor chip 800 may be stacked on the package substrate 600 via the interposer substrate 700. The interposer substrate 700 may electrically connect the package structure PS and the processor chip 800 to each other.

The substrate 701 may be formed of at least one of, for example, silicon, an organic material, plastic, or a glass substrate. When the substrate 701 is a silicon substrate, the interposer substrate 700 may be referred to as a silicon interposer. Unlike that which is illustrated in the drawing, when the substrate 701 is an organic substrate, the interposer substrate 700 may be referred to as a panel interposer.

A lower protective layer 703 may be disposed on a lower surface of the substrate 701, and lower pads 705 may be disposed on the lower protective layer 703. The lower pads 705 may be connected to the through-vias 730. The package structure PS and the processor chip 800 may be electrically connected to the package substrate 600 through conductive bumps 720 disposed on the lower pads 705.

The interconnect structure 710 may be disposed on an upper surface of the substrate 701, and may include an interlayer insulating layer 711 and a single-layer or multi-layer wiring structure 712. When the wiring structure 710 has a multilayer wiring structure, wiring patterns of different layers may be connected to each other through contact vias. The upper pad 704 connected to the wiring structure 712 may be disposed on the interconnect structure 710. The package structure PS and the processor chip 800 may be connected to the upper pads 704 through the connection bumps 236.

The through-vias 730 may extend from the upper surface to the lower surface of the substrate 701 to penetrate through the substrate 701. For example, the through-via 730 may extend inwardly of the wiring structure 710 to be electrically connected to wirings of the wiring structure 710. When the substrate 701 is silicon, the through-via 730 may be referred to as a through-silicon via (TSV).

The interposer substrate 700 may be used to convert or transmit an input electrical signal between the package substrate 600 and the package structure PS or the processor chip 800. Accordingly, the interposer substrate 700 may not include devices such as active devices or passive devices. According to example embodiments, the interconnect structure 710 may be disposed below the substrate 701.

The conductive bumps 720 may be disposed on the lower surface of the interposer substrate 700 and may be electrically connected to the interconnect structure 710. The interposer substrate 700 may be mounted on the package substrate 600 through the conductive bumps 720. As an example, among the lower pads 705, some lower pads 705 used for power or grounding may be integrated and connected to the conductive bumps 720 together, so that the number of the lower pads 705 may be greater than or equal to the number of the conductive bumps 720.

The logic chip or processor chip 800 may include, for example, a central processing unit (CPU), a graphics processing unit (GPU), a field programmable gate array (FPGA), a digital signal processor (DSP), a cryptographic processor, a microprocessor, a microcontroller, an analog-to-digital converter, an application specific integrated circuit (ASIC), or the like. Depending on the types of integrated circuits included in the chip 800, the semiconductor package 10B may be referred to as a server-oriented semiconductor package or a mobile-oriented semiconductor package. According to example embodiments, the logic chip 800 and/or the package structure PS mounted on the interposer substrate 700 may be provided in a greater or lesser number than is illustrated in the drawings.

FIGS. 12A to 12G are cross-sectional views illustrating a portion of a method of manufacturing the semiconductor package 10B of FIG. 10.

Figure 12A:
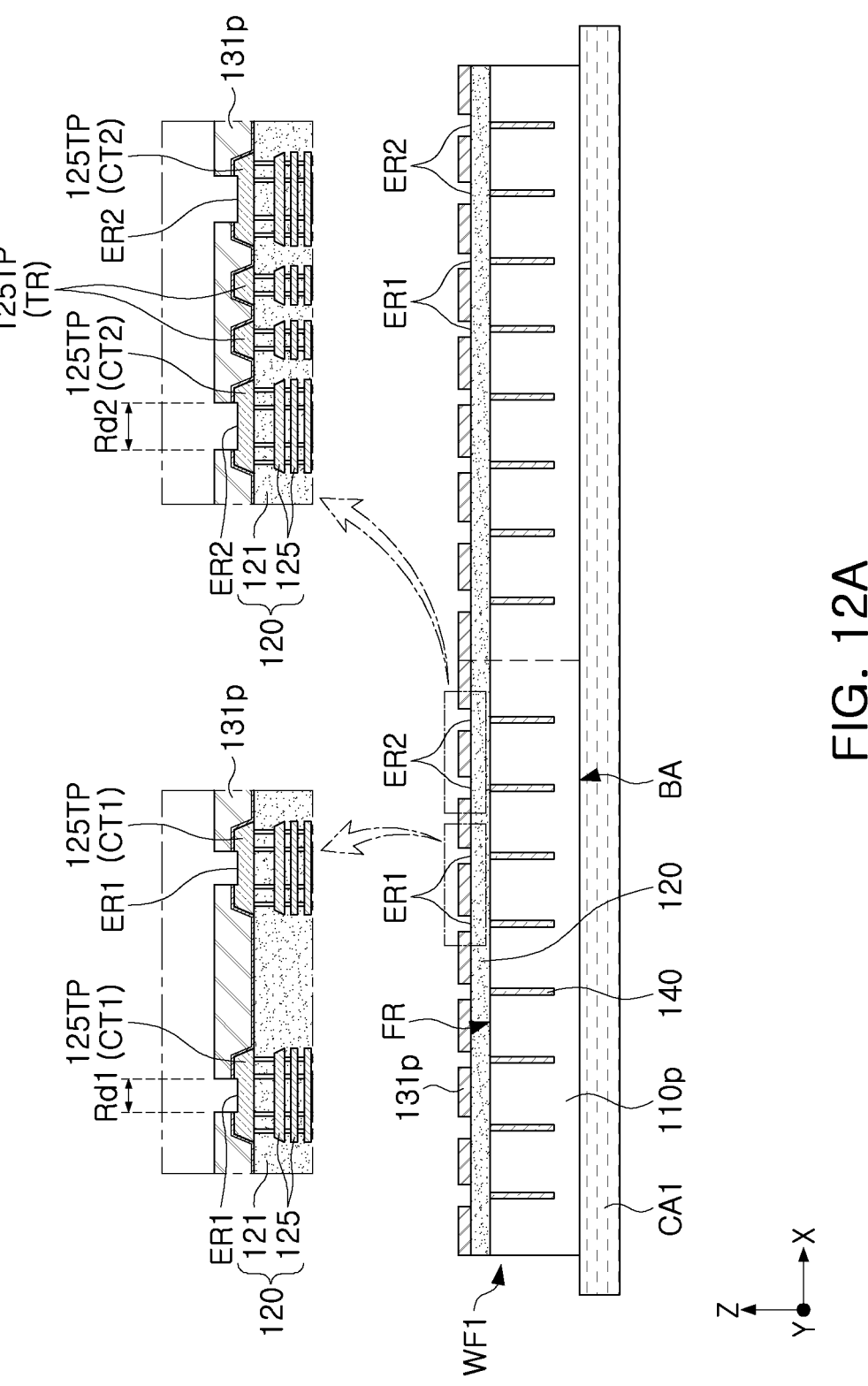
FIGS. 12A to 12G are cross-sectional views illustrating a portion of a method of manufacturing the semiconductor package of FIG. 10.

Referring to FIG. 12A, a first semiconductor wafer WF1 may be prepared. The first semiconductor wafer WF1 may be temporarily supported on a first carrier substrate CA1.

The first semiconductor wafer WF1 may include components for a plurality of semiconductor chips (or "first semiconductor chips"). For example, the first semiconductor wafer WF1 may specifically include a preliminary substrate 110p, a circuit layer 120 disposed on a front surface FR of the preliminary substrate 110p, and through-electrodes 140 connected to a wiring structure of the circuit layer 120. The through-electrodes 140 may be formed before or during the formation of the circuit layer 120, but may not be formed to completely penetrate through the preliminary substrate 110p. The circuit layer 120 may include at least a pair of first contact patterns CT1, at least a pair of second contact patterns CT2, and at least one trace pattern TR disposed between each pair of second contact patterns CT2.

Then, a preliminary insulating layer 131p having a first etching groove ER1 and a second etching groove ER2 may be formed on the first semiconductor wafer WF1.

The preliminary insulating layer 131p includes or is formed of, for example, a silicon oxide (SiO) and/or a silicon carbonitride (SiCN), and may be formed using a PVD or CVD process. The first etching groove ER1 and the second etching groove ER2 may be formed by etching at least a portion of the preliminary insulating layer 131p formed on the circuit layer 120. The first etching groove ER1 and the second etching groove ER2 may be formed using, for example, an etching process such as reactive-ion etching (RIE) using a photoresist, not illustrated. As an example, a recess width Rd1 of the first etching groove ER1 may be narrower than a recess width Rd2 of the second etching groove ER2.

Figure 12B:
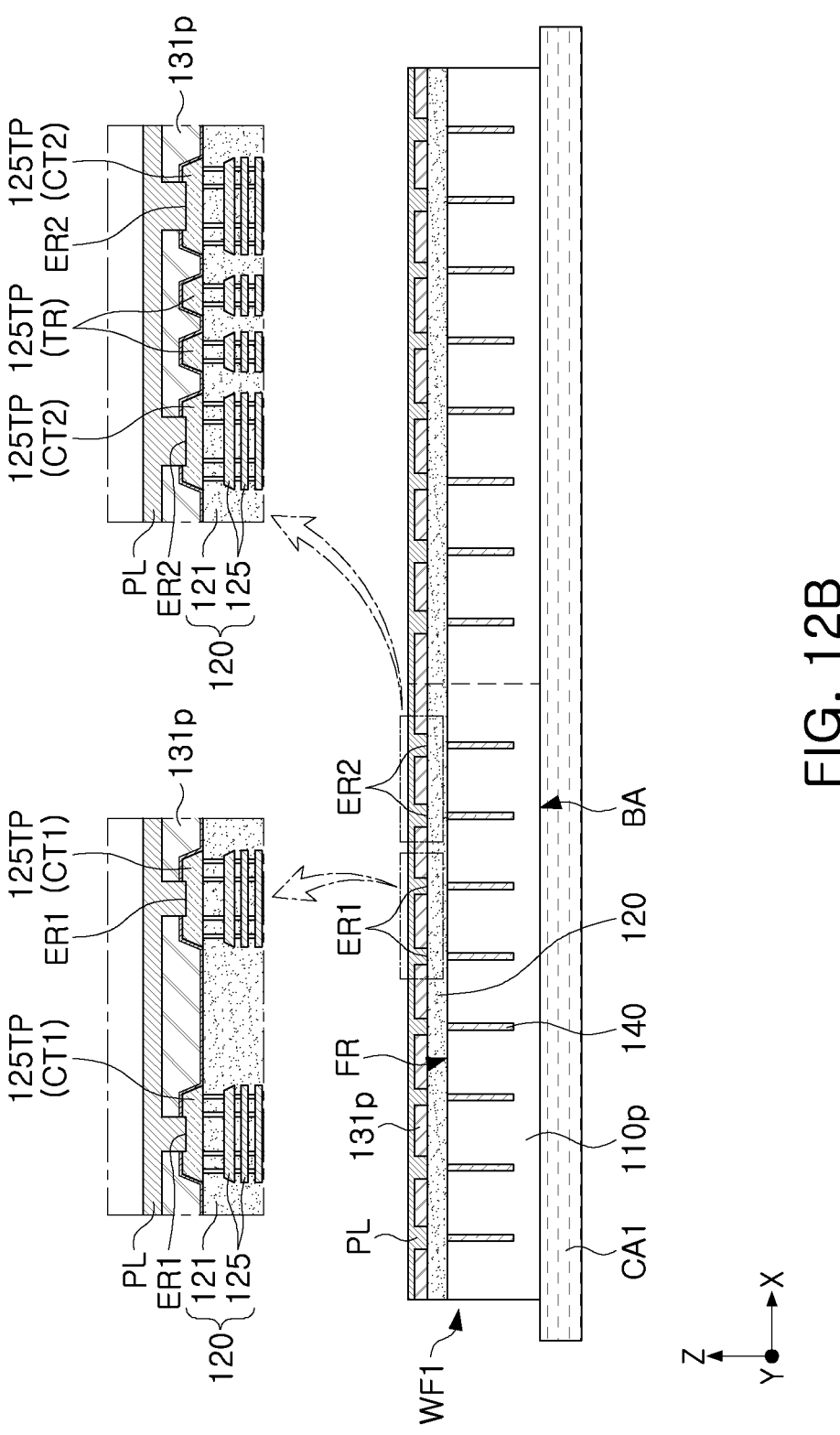

Referring to FIG. 12B, a conductive material layer PL may be formed on the preliminary insulating layer 131p.

The conductive material layer PL may fill the first etching groove ER1 and the second etching groove ER2. The conductive material layer PL may be formed using a plating process, a PVD process, or a CVD process. For example, the conductive material layer PL may include or may be copper (Cu) or a copper (Cu) alloy. A seed layer, not illustrated, including or formed of at least one of copper (Cu), titanium (Ti), a copper (Cu) alloy, or a titanium alloy may be formed below the conductive material layer PL.

Figure 12C:
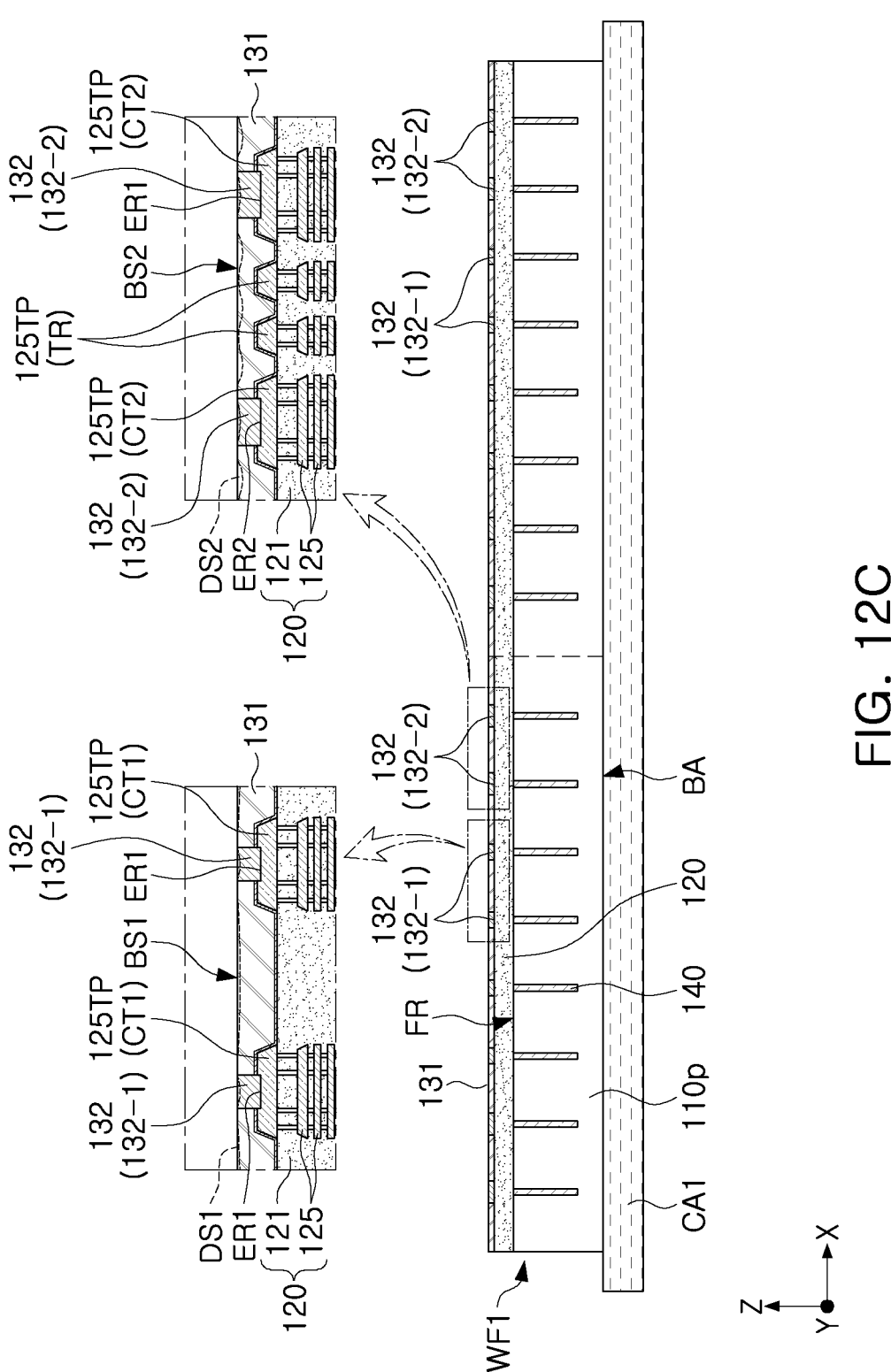

Referring to FIG. 12C, the conductive material layer PL and the preliminary insulating layer 131p may be polished to form a plurality of first pads 132 and a front insulating layer 131 surrounding the plurality of first pads 132.

A portion of the conductive material layer PL may be removed by a polishing process, and a first group of first pads 132-1 may be formed to fill the first etching groove ER1 and a second group of second pads 132-2 may be formed to fill the second etching groove ER2. The polishing process may include, for example, a chemical mechanical polishing (CMP) process.

A first bonding surface BS1 and a second bonding surface BS2 may be formed on the first semiconductor wafer WF. According to the present embodiment, the first group of first pads 132-1 may be formed to have a first area, smaller than a second area of the second group of first pads 132-2. Accordingly, after the polishing process, a first dishing surface DS1 formed on a first bonding surface BS1 and a second dishing surface DS2 formed on the second bonding surface BS2 may be controlled, and surface topology characteristic may be improved.

Figures 12D, 12E:
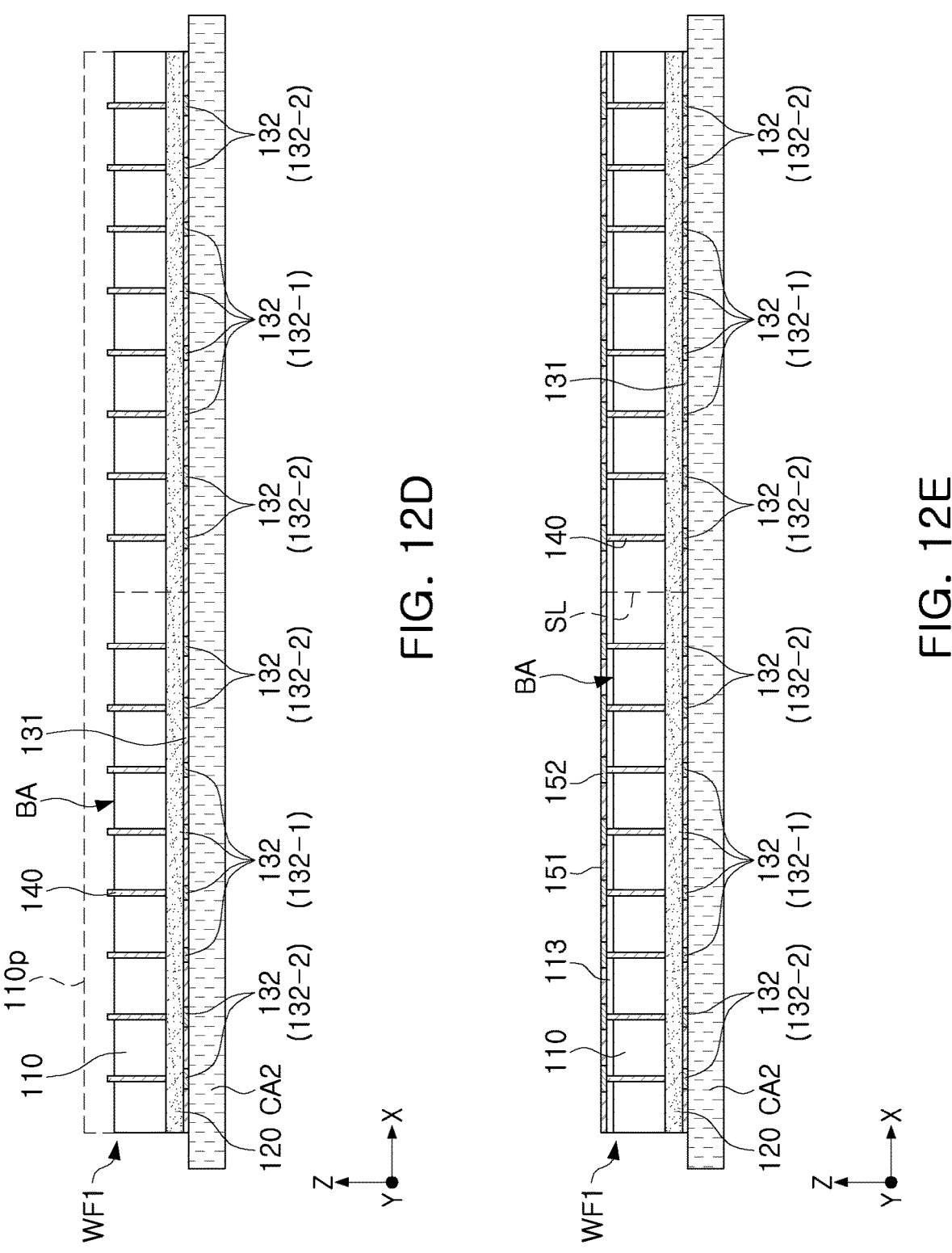

Referring to FIG. 12D, a portion of the preliminary substrate 110p may be removed to form a substrate 110 having a rear surface BA from which the plurality of through-electrodes 140 protrude.

After the process of FIG. 12C is completed, the first semiconductor wafer WF1 may be vertically inverted to be temporarily supported on the second carrier substrate CA2. A portion of the preliminary substrate 110p may be removed by applying a polishing process. The polishing process may be performed by a CMP process, an etch-back process, or a combination thereof. For example, the preliminary substrate 110p may be reduced to a predetermined thickness by performing a CMP process, and the through-electrodes 140 may be sufficiently exposed by applying an etch-back process under appropriate conditions.

Referring to FIG. 12E, an insulating protective layer 113, a rear insulating layer 151, and a rear pad 152 may be formed on the rear surface BA of the substrate 110.

The insulating protective layer 113 and the rear insulating layer 151 may include, for example, a silicon oxide (SiO) and/or a silicon carbonitride (SiCN), and may be formed using a PVD or CVD process. The rear pad 152 may be formed using, for example, a plating process, a PVD process, or a CVD process. Then, the first semiconductor wafer WF1 may be cut along scribe lanes SL, and a plurality of semiconductor chips may be separated from each other.

Figure 12F:
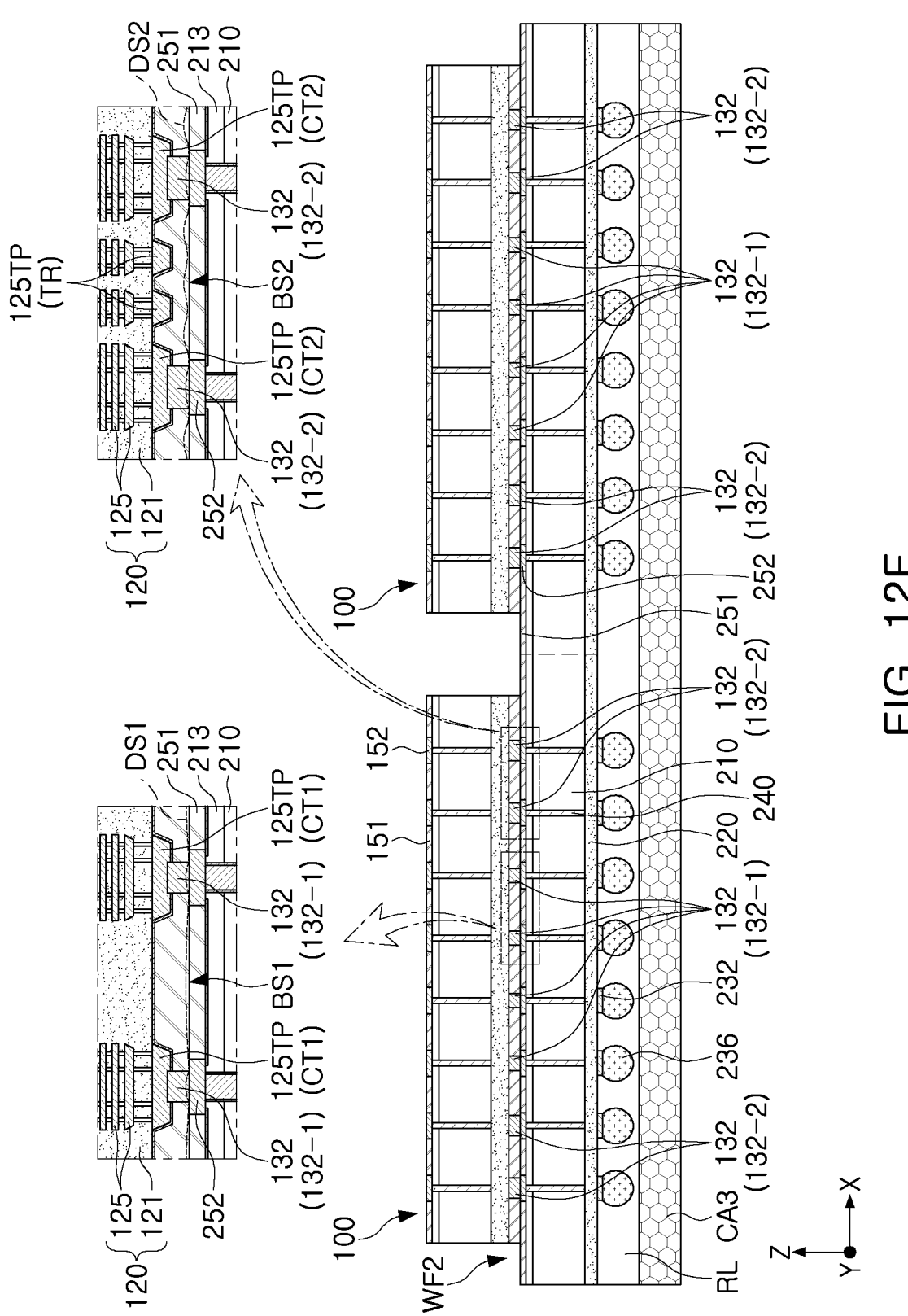

Referring to FIG. 12F, a second semiconductor wafer WF2 may be prepared.

The second semiconductor wafer WF2 may be temporarily supported on the third carrier substrate CA3 by a bonding material layer RL such as a glue. The second semiconductor wafer WF2 may include components for a plurality of second semiconductor chips. In addition, a connection bump 236 buried in a bonding material layer RL may be disposed below the second semiconductor wafer WF2.

Then, first semiconductor chips 100 may be disposed on the second semiconductor wafer WF2.

Each of the first semiconductor chips 100 may include a plurality of first pads 132 formed by a manufacturing process, similar to that of FIGS. 12A to 12E. The plurality of first semiconductor chips 100 may be disposed such that the first dishing surface DS1 and the second dishing surface DS2 are bonded to the second semiconductor wafer WF2. Then, a thermal compression process may be performed to couple the first front insulating layer 131 and the second rear insulating layer 251 to each other and to couple the first front pads 132 and the second rear pads 252 to each other. For example, the thermal compression process may be performed in a thermal atmosphere ranging from about 100° C. to about 300° C. However, the temperature of the thermal atmosphere is not limited to the above-described range (about 100° C. to about 300° C.) and may vary. The first and second dishing surfaces DS1 and DS2 may expand during the thermal compression process to form a bonding interface between the second semiconductor wafer WF2 and the first semiconductor chips 100.

Figure 12G:
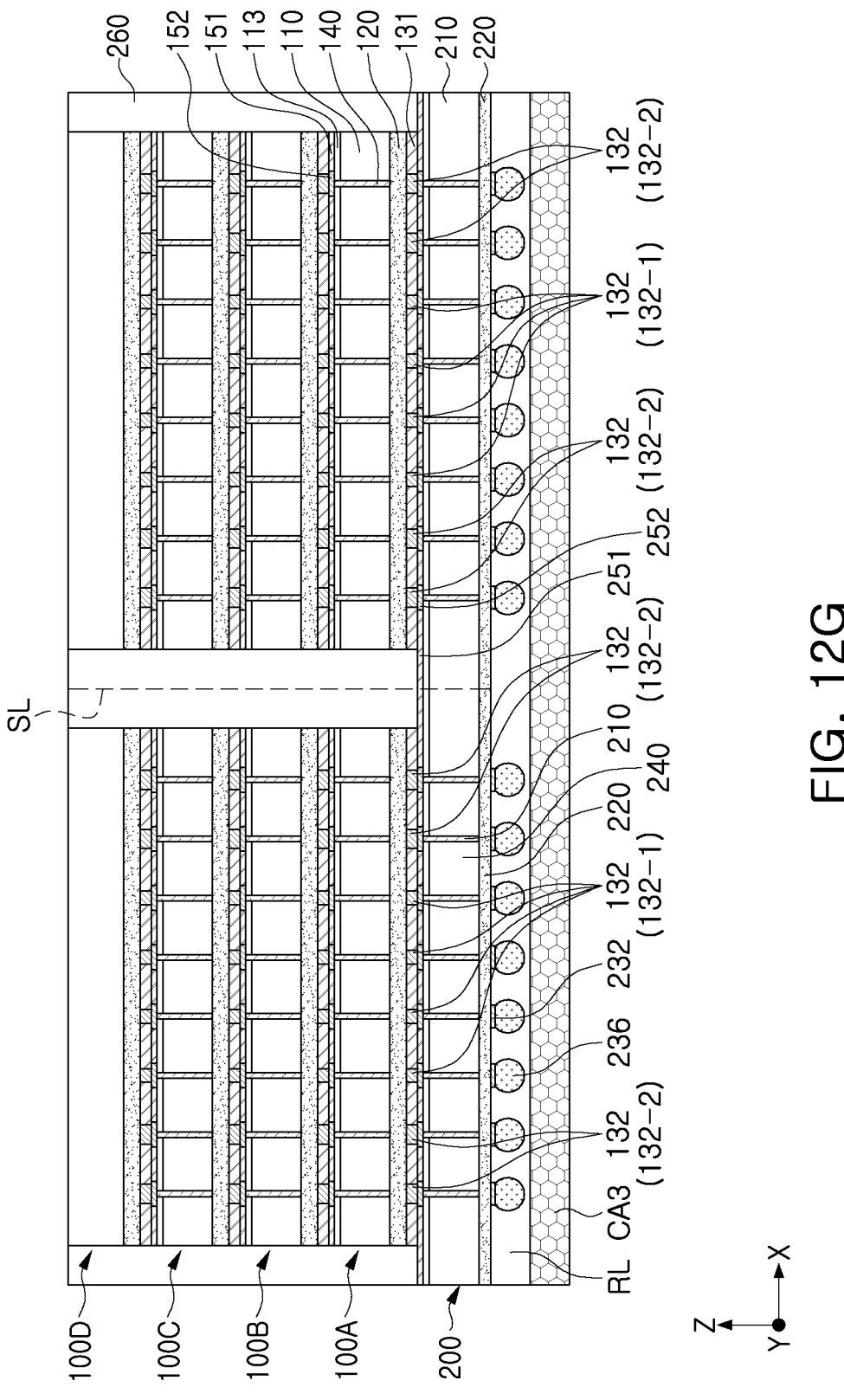

Referring to FIG. 12G, a plurality of first semiconductor chips 100B, 100C, and 100D may be stacked on the second semiconductor wafer WF2.

The plurality of first semiconductor chips 100A, 100B, 100C, and 100D may be stacked in a vertical direction (a Z-direction) by repeating the process of FIG. 12F. Since each of the plurality of first semiconductor chips 100A, 100B, 100C, and 100D are formed by manufacturing processes similar to those of FIGS. 12A to 12E, a bonding interface having improved quality may be formed therebetween.

Then, a molding member 260 may be formed to cover the plurality of first semiconductor chips 100A, 100B, 100C, and 100D, and may then be cut along the scribe lanes SL to separate the semiconductor packages from each other.

According to the disclosed embodiments, for a direct-bonding semiconductor device having a plurality of connection pads on its surface, a ratio of areas of each pair of pads to their respective top wiring patterns, within a same-sized region, is kept substantially constant (e.g., 0.4 in one embodiment) across the different types of connection pads. As described above, an area of a bonding pad may vary depending on a distribution of top wiring patterns, and thus a semiconductor chip having improved surface topology characteristics of a bonding surface may be provided.

In addition, a semiconductor chip stack using the semiconductor chip may be implemented to provide a semiconductor package having quality of a bonding interface of the semiconductor chip stack.

While example embodiments have been shown and described above, it will be apparent to those skilled in the art that modifications and variations could be made without departing from the scope of the present inventive concept as defined by the appended claims.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

What is claimed is:

1. A semiconductor package comprising:
a first semiconductor chip including a first substrate, a plurality of first pads disposed on a front surface of the first substrate, a first insulating layer surrounding the plurality of first pads, and a plurality of wiring patterns disposed between the first substrate and the plurality of first pads and electrically connected to the plurality of first pads; and
a second semiconductor chip disposed below the first semiconductor chip and including a second substrate, a plurality of second pads disposed on the second substrate and contacting the plurality of first pads, a second insulating layer surrounding the plurality of second pads and contacting the first insulating layer, and a plurality of through-electrodes penetrating through the second substrate to be connected to the plurality of second pads,
wherein the plurality of wiring patterns include top wiring patterns adjacent to the plurality of first pads in a direction perpendicular to the front surface,
wherein, on a plane parallel to the front surface, within a first region having a first shape and first region area from a top down view, first top wiring patterns have a first occupied area between adjacent first pads of a first group of first pads from among the plurality of first pads, and within a second region having the first shape and first region area from the top down view, second top wiring patterns have a second occupied area, larger than the first occupied area, between adjacent first pads of a second group of first pads from among the plurality of first pads, and
wherein, from the top down view, each pad of the first group of first pads has a first area, and each pad of the second group of first pads has a second area, wherein the first area is smaller than the second area.

2. The semiconductor package of claim 1, wherein:
the first occupied area is equal to a sum of areas of the top wiring patterns that are disposed in the first region, wherein the first region has at least a pair of first parallel sides, respectively passing through centers of corresponding adjacent first pads of the first group of first pads, and
the second occupied area is equal to a sum of areas of the top wiring patterns that are disposed in the second region, wherein the second region has at least a pair of second parallel sides, respectively passing through centers of corresponding adjacent first pads of the second group of first pads.

3. The semiconductor package of claim 2, wherein:
centers of the first parallel sides match the centers of first pads of the first group of first pads, respectively, and
centers of the second parallel sides match the centers of first pads of the second group of first pads, respectively.

4. The semiconductor package of claim 2, wherein:
a length of the first parallel sides is the same as a distance between the centers of two adjacent first pads of the first group of first pads, and a length of the second parallel sides is the same as a distance between the centers of two adjacent first pads of the second group of first pads.

5. The semiconductor package of claim 2, wherein:

a first ratio of the first area to the first occupied area and a second ratio of the second area to the second occupied area are each about 0.4 or less.

6. The semiconductor package of claim 1, wherein:

the top wiring patterns include first contact patterns, respectively contacting first pads of the first group of first pads, second contact patterns, respectively contacting first pads of the second group of first pads, and at least one trace pattern disposed between adjacent second contact patterns.

7. The semiconductor package of claim 1, wherein the first semiconductor chip further includes a capping barrier layer extending between the first insulating layer and the top wiring patterns.

8. The semiconductor package of claim 7, wherein:

the capping barrier layer includes at least one of silicon nitride (SiN), silicon carbide (SiC), silicon oxynitride (SiON), silicon carbonitride (SiCN), aluminum nitride (AlN), aluminum oxynitride (AlON), aluminum oxide (AlO), or aluminum oxycarbide (AlOC).

9. The semiconductor package of claim 1, wherein:

the plurality of first pads include copper (Cu) or a copper (Cu) alloy, and the top wiring patterns include aluminum (Al) or an aluminum (Al) alloy.

10. The semiconductor package of claim 1, wherein:

the first area of each pad of the first group of first pads is smaller than an area of each pad of the plurality of second pads.

11. The semiconductor package of claim 10, wherein:

a contact area between each pad of the first group of first pads and each respective pad of the plurality of second pads is about 50% or more of the first area.

12. The semiconductor package of claim 1, wherein:

the first insulating layer includes a lower insulating layer, contacting the second insulating layer, and an upper insulating layer disposed on the lower insulating layer.

13. The semiconductor package of claim 12, wherein:

the lower insulating layer includes a silicon carbonitride (SiCN), and the upper insulating layer and the second insulating layer include a silicon oxide (SiO).

14. The semiconductor package of claim 1, wherein:

the plurality of first pads include a third group of first pads including pairs adjacent to each other, each first pad of the third group of first pads having a third area larger than the second area, and within a region having the same shape and area as each of the first region and second region, the top wiring patterns include a third contact pattern having a third occupied area, larger than the second occupied area, between adjacent pads of the third group of first pads.

15. The semiconductor package of claim 14, wherein:

the third group of first pads contact the third contact pattern.

16. A semiconductor package comprising:

a first semiconductor chip including a first substrate, a plurality of first pads disposed on a front surface of the first substrate, a first insulating layer surrounding the plurality of first pads, and top wiring patterns adjacent to the plurality of first pads between the first substrate and the plurality of first pads in a direction perpendicular to the front surface; and a second chip disposed below the first semiconductor chip and including a second substrate, a plurality of second pads disposed on the second substrate and contacting the plurality of first pads, a second insulating layer surrounding the plurality of second pads and contacting the first insulating layer, and a plurality of through-electrodes penetrating through the second substrate to be connected to the plurality of second pads, wherein the top wiring patterns include a set of first contact patterns contacting a first group of first pads, the first group of first pads including pairs of first pads adjacent to each other in a first direction parallel to the front surface, a set of second contact patterns contacting a second group of first pads, the second group of first pads including pairs of first pads adjacent to each other in the first direction, and at least one trace pattern disposed between adjacent contact patterns of the second contact patterns in the first direction, and wherein each first pad of the first group of first pads has a first width in the first direction, and each pad of the second group of first pads has a second width in the first direction, wherein the first width is narrower than the second width.

17. The semiconductor package of claim 16, wherein:

in the first direction, a first maximum width of each of the first contact patterns is the same as a second maximum width of each of the second contact patterns.

18. A semiconductor package comprising:

at least one semiconductor chip including a first substrate, a plurality of first pads disposed on a front surface of the first substrate, a first insulating layer surrounding the plurality of first pads, and a plurality of wiring patterns disposed between the first substrate and the plurality of first pads and electrically connected to the plurality of first pads, wherein the plurality of first pads include first pairs of first pads and second pairs of first pads, each first pad of each first pair having a first area from a plan view and each first pad of each second pair having a second area from the plan view, the second area being different from the first area;

wherein, within respective first reference regions in the plan view between two pads of respective first pairs of first pads adjacent to each other, respective first top wiring patterns adjacent to the respective first pairs of first pads in a direction perpendicular to the front surface have a first predetermined occupied area, wherein, within respective second reference regions in the plan view between two pads of respective second pairs of first pads adjacent to each other, respective second top wiring patterns adjacent to the respective second pairs of first pads in a direction perpendicular to the front surface have a second predetermined occupied area, wherein each first reference region has the same area and shape as each second reference region in the plan view, wherein each first pair of first pads in a respective reference region in the plan view has an area within the respective reference region proportional to a respective first predetermined occupied area according to a first ratio, and wherein each second pair of first pads in a respective reference region in the plan view has an area within the respective reference region proportional to a respective second predetermined occupied area according to the first ratio.

19. The semiconductor package of claim 18, wherein:

each first reference region has a pair of parallel first sides, respectively passing through centers of first pads of each first pair of first pads, and a pair of second sides connecting ends of the pair of first sides to each other and parallel to each other, and a length of the first sides is the same as a length of the second sides, and each second reference region has a pair of parallel first sides, respectively passing through centers of first pads of each second pair of first pads, and a pair of second sides connecting ends of the pair of first sides to each other and parallel to each other, and a length of the first sides is the same as a length of the second sides.

20. The semiconductor package of claim 18, wherein:

each predetermined occupied area is equal to a sum of areas of the top wiring patterns disposed in a respective reference region.

\* \* \* \* \*